(12) United States Patent
Yang et al.

(10) Patent No.: US 11,864,373 B2
(45) Date of Patent: Jan. 2, 2024

(54) METHOD FOR MANUFACTURING SEMICONDUCTOR STRUCTURE WITH CORE AND PERIPHERAL REGIONS AND SEMICONDUCTOR STRUCTURE THEREOF

(71) Applicant: CHANGXIN MEMORY TECHNOLOGIES, INC., Hefei (CN)

(72) Inventors: Mengmeng Yang, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 52 days.

(21) Appl. No.: 17/579,817

(22) Filed: Jan. 20, 2022

(65) Prior Publication Data
US 2022/0344351 A1 Oct. 27, 2022

Related U.S. Application Data

(63) Continuation of application No. PCT/CN2021/108970, filed on Jul. 28, 2021.

(30) Foreign Application Priority Data

Apr. 23, 2021 (CN) .......................... 202110444445.9

(51) Int. Cl.
*H01L 27/108* (2006.01)
*H01L 21/768* (2006.01)
*H10B 12/00* (2023.01)

(52) U.S. Cl.
CPC ....... *H10B 12/09* (2023.02); *H01L 21/76865* (2013.01); *H01L 21/76883* (2013.01); *H10B 12/485* (2023.02)

(58) Field of Classification Search
CPC . H10B 12/09; H10B 12/485; H01L 21/76865; H01L 21/76883
See application file for complete search history.

(56) References Cited

U.S. PATENT DOCUMENTS 7,915,121 B1 3/2011 Kim
9,087,888 B2 7/2015 Yanagita et al.
(Continued)

FOREIGN PATENT DOCUMENTS

CN 102097375 A 6/2011
CN 102339829 A 2/2012
(Continued)

*Primary Examiner* — John P. Dulka
(74) *Attorney, Agent, or Firm* — Cooper Legal Group, LLC

(57) ABSTRACT

A method for manufacturing a semiconductor structure and a semiconductor structure are provided. The method includes the following operations. A substrate is provided, includes a core region and a peripheral region. A preset barrier layer is formed on the substrate, and covers the core region and the peripheral region. At least a part of the preset barrier layer corresponding to the peripheral region is removed to expose a part of the substrate, and to take a reserved part of the preset barrier layer as a first barrier layer. A dielectric layer and a first conductive layer are successively formed on the first barrier layer and the substrate. A part of the dielectric layer and the first conductive layer on the first barrier layer are removed, to reserve a part of the dielectric layer and the first conductive layer on the first barrier layer closer to the peripheral region.

14 Claims, 49 Drawing Sheets

(56) References Cited

U.S. PATENT DOCUMENTS

| | | |
|---|---|---|
| 9,368,399 B2 | 6/2016 | Yoo |
| 9,768,176 B2 | 9/2017 | Yoo |
| 2012/0012911 A1 | 1/2012 | Jeong |
| 2014/0252417 A1 | 9/2014 | Yanagita et al. |
| 2015/0014767 A1* | 1/2015 | Yoo .................. H01L 29/456 |
| | | 257/334 |
| 2016/0268262 A1 | 9/2016 | Yoo |

FOREIGN PATENT DOCUMENTS

| | | |
|---|---|---|
| CN | 104037211 A | 9/2014 |
| CN | 112385032 A | 2/2021 |
| CN | 112466888 A | 3/2021 |
| KR | 20110003039 A | 1/2011 |

* cited by examiner

METHOD FOR MANUFACTURING SEMICONDUCTOR STRUCTURE WITH CORE AND PERIPHERAL REGIONS AND SEMICONDUCTOR STRUCTURE THEREOF

CROSS-REFERENCE TO RELATED APPLICATION

The present application is a U.S. continuation application of International Application No. PCT/CN2021/108970, filed on Jul. 28, 2021, which claims priority to the Chinese patent application No. 202110444445.9, filed on Apr. 23, 2021. International Application No. PCT/CN2021/108970 and Chinese patent application No. 202110444445.9 are incorporated herein by reference in their entireties.

TECHNICAL FIELD

The present disclosure relates to the technical field of semiconductor manufacturing, and in particular to a method for manufacturing a semiconductor structure and a semiconductor structure.

BACKGROUND

A semiconductor structure is generally applied to electronic devices such as a memory, a controller, and the like. When the semiconductor structure is used in the memory, a capacitor is typically formed in an array region where data is stored, and a Metal Oxide Semiconductor Field Effect Transistor (MOSFET) is typically formed in an edge region outside the array region. The metal oxide field effect transistor generally may include a P-type transistor (PMOS) and an N-type transistor (NMOS), depending on a doping type. The two types of transistors are typically provided with dielectric layers with high-k, so as to increase the breakdown voltage of the transistors.

In the related art, when manufacturing the semiconductor structure, a first barrier layer is typically formed on a substrate. The substrate includes a core region and a peripheral region arranged outside the core region. The first barrier layer in the peripheral region is removed, and the first barrier layer in the core region is reserved. A dielectric layer and a first conductive layer are successively laminated on the first barrier layer, and the substrate located in the peripheral region. The dielectric layer and the first conductive layer in the core region are removed, and the dielectric layer and the first conductive layer in the peripheral region are reserved.

However, during the above procedure of manufacturing the semiconductor structure, a fracture is liable to occur between the dielectric layer located in the peripheral region and the first barrier layer located in the core region, after the dielectric layer and the first conductive layer in the core region are removed. The presence of the fracture causes the exposed substrate to be removed and even causes a device in the substrate to be damaged.

SUMMARY

In a first aspect, the embodiments of the present disclosure provide a method for manufacturing a semiconductor structure. The method includes the following operations. A substrate is provided. The substrate includes a core region, and a peripheral region located outside the core region and adjacent to the core region. A preset barrier layer is further formed on the substrate, and covers the core region and the peripheral region. At least a part of the preset barrier layer corresponding to the peripheral region is removed to expose a part of the substrate, and take a reserved part of the preset barrier layer as a first barrier layer. A dielectric layer and a first conductive layer, which are laminated, are successively formed on the first barrier layer and the substrate. A part of the dielectric layer and a part of the first conductive layer on the first barrier layer are removed to reserve a part of the dielectric layer and a part of the first conductive layer on the first barrier layer closer to the peripheral region.

In a second aspect, the embodiments of the present disclosure provide a semiconductor structure. The semiconductor structure includes: a substrate including a core region, and a peripheral region located outside the core region and adjacent to the core region, and an active area being further arranged in the substrate; a first barrier layer arranged on the substrate, covering at least the core region; a dielectric layer arranged on the substrate and a part of the first barrier layer; and a first conductive layer arranged on the dielectric layer.

DETAILED DESCRIPTION

Figure 1:
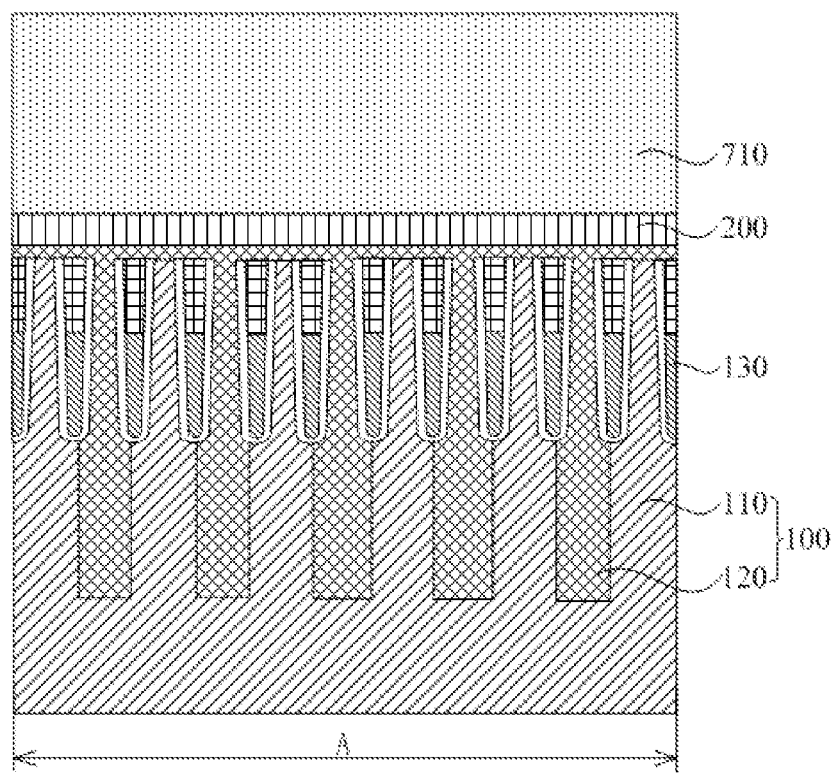
FIG. 1 is a cross-sectional view of a first cross-section in a core region after a first photoresist layer is formed in the related art.
Figure 2:
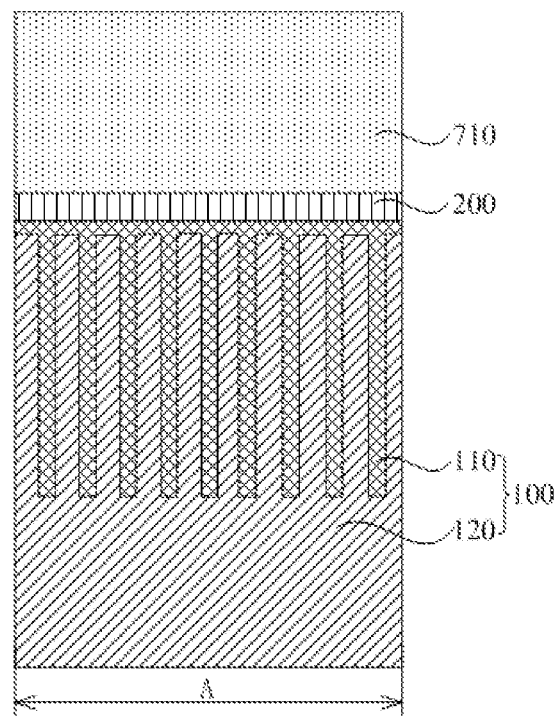
FIG. 2 is a cross-sectional view of a second cross-section in a core region after a first photoresist layer is formed in the related art.
Figure 3:
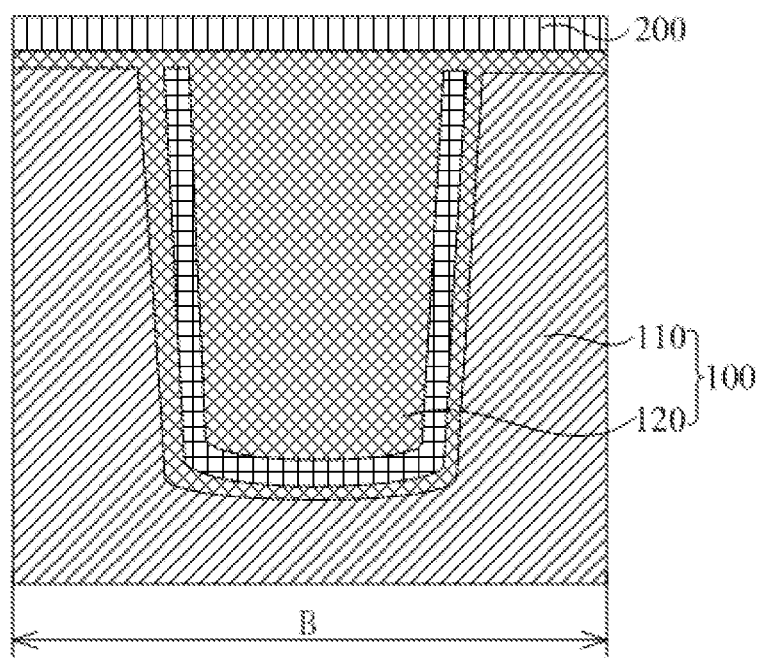
FIG. 3 is a cross-sectional view of a second cross-section in a peripheral region after a first photoresist layer is formed in the related art.
Figure 4:
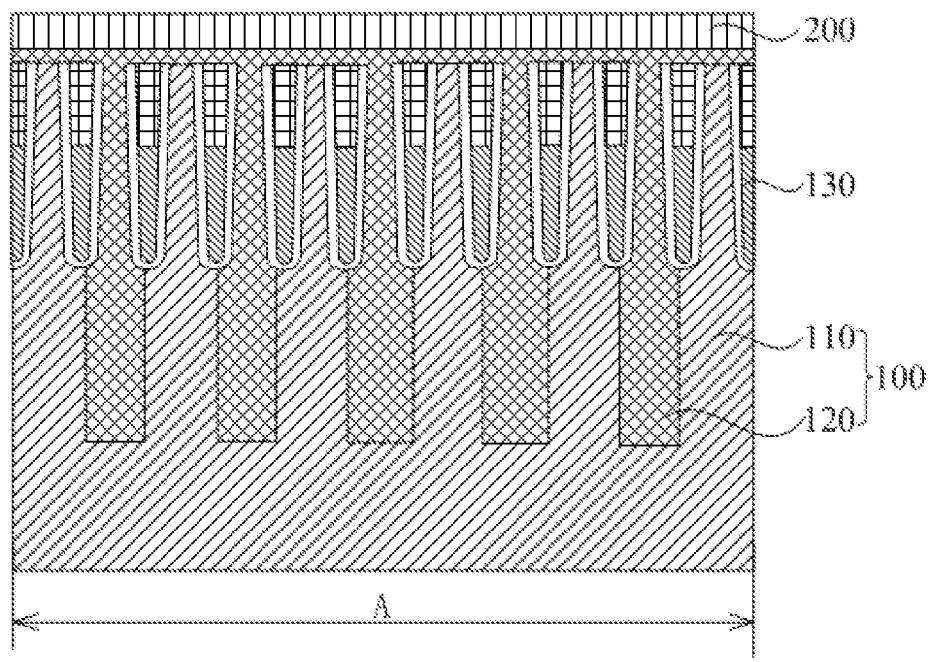
FIG. 4 is a cross-sectional view of a first cross-section in a core region after a first barrier layer corresponding to a peripheral region is removed in the related art.
Figure 5:
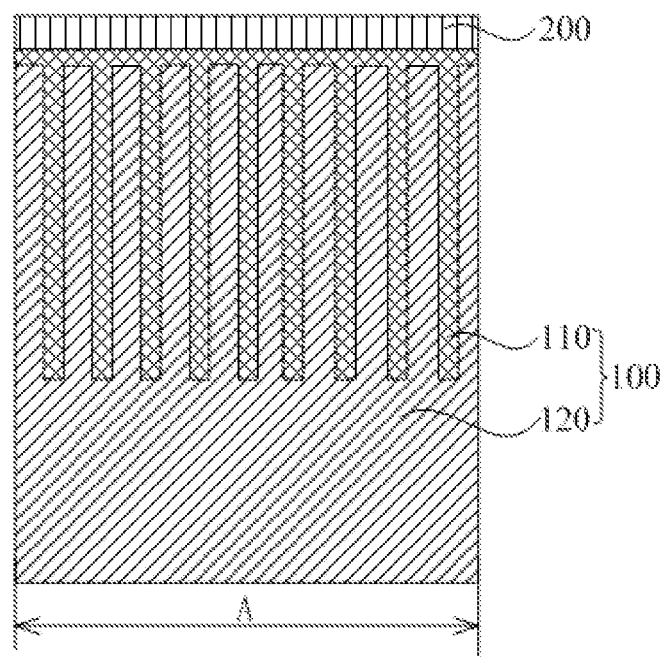
FIG. 5 is a cross-sectional view of a second cross-section in the core region after a first barrier layer corresponding to a peripheral region is removed in the related art.
Figure 6:
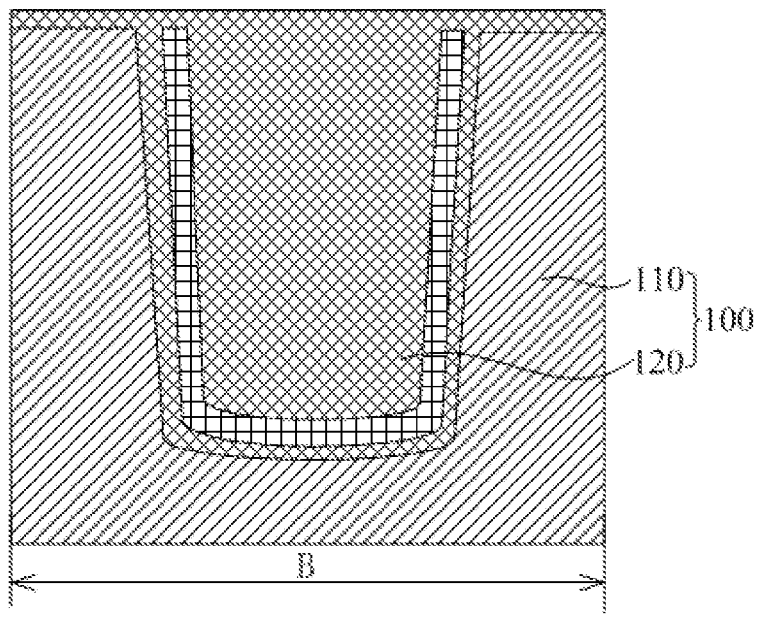
FIG. 6 is a cross-sectional view of a second cross-section in a peripheral region after a first barrier layer corresponding to a peripheral region is removed in the related art.
Figure 7:
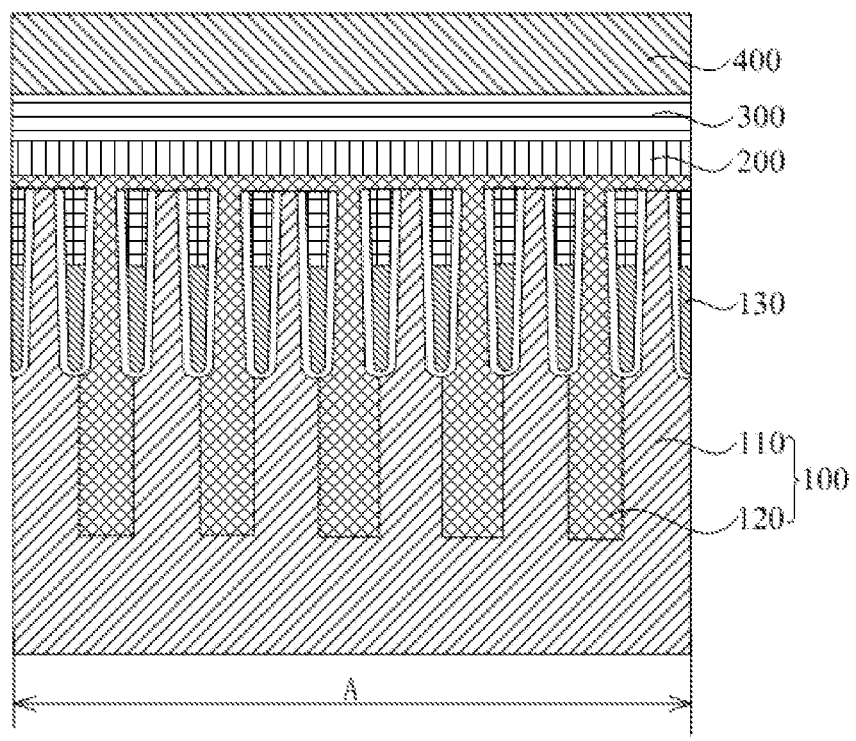
FIG. 7 is a cross-sectional view of a first cross-section in a core region after a dielectric layer and a first conductive layer are formed in the related art.
Figure 8:
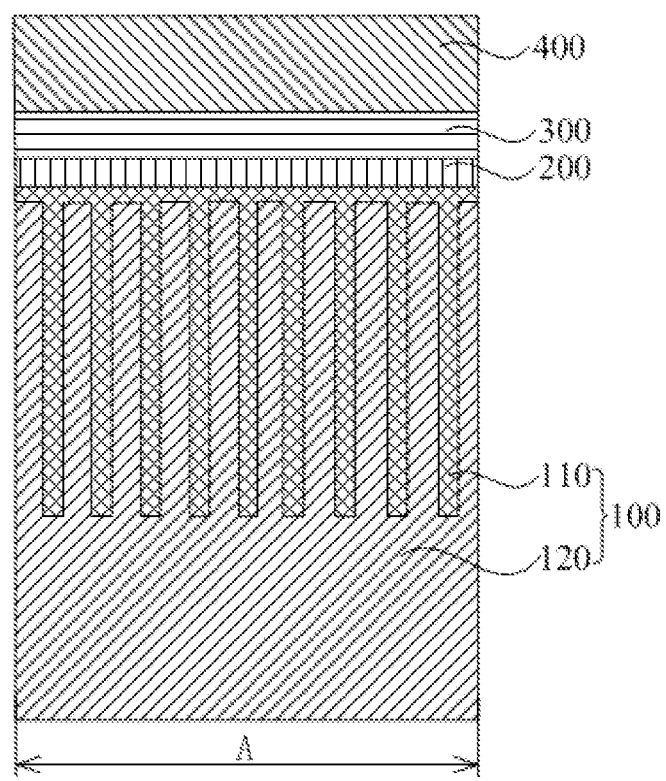
FIG. 8 is a cross-sectional view of a second cross-section in a core region after a dielectric layer and a first conductive layer are formed in the related art.
Figure 9:
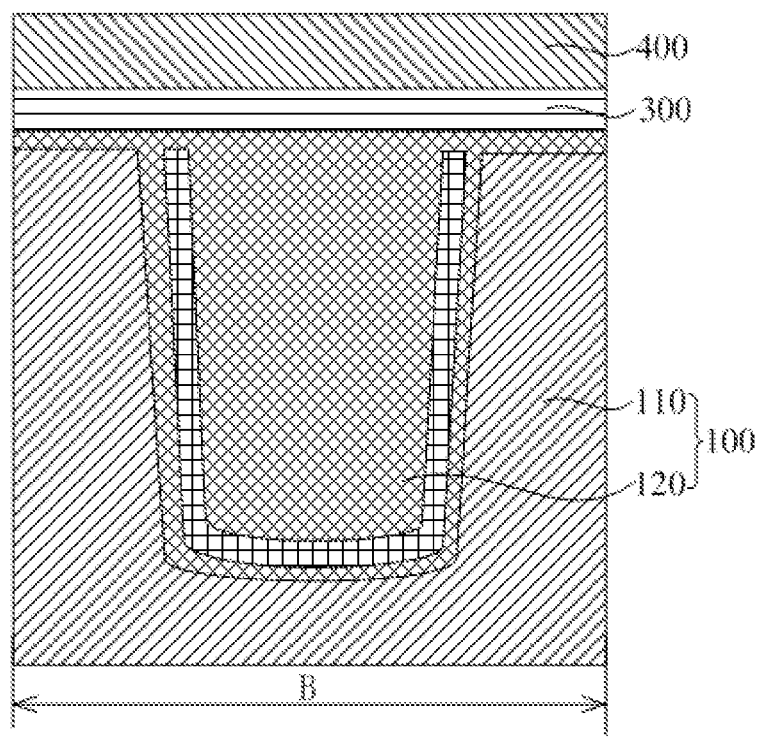
FIG. 9 is a cross-sectional view of a second cross-section in a peripheral region after a dielectric layer and a first conductive layer are formed in the related art.
Figure 10:
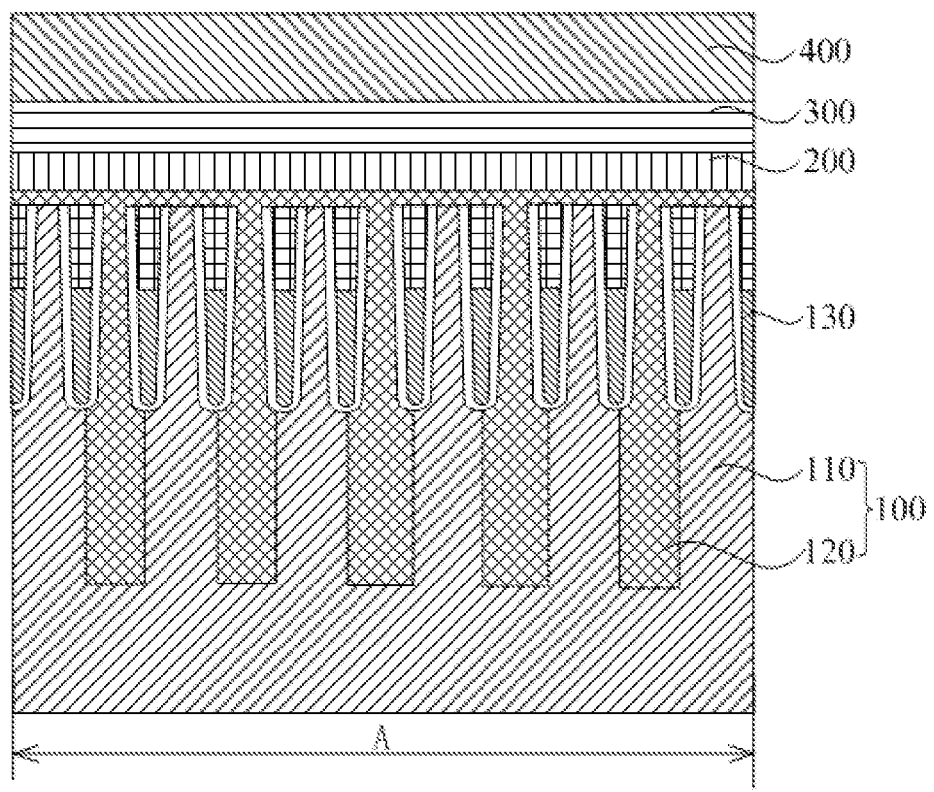
FIG. 10 is a cross-sectional view of a first cross-section in a core region after a second photoresist layer is formed in the related art.
Figure 11:
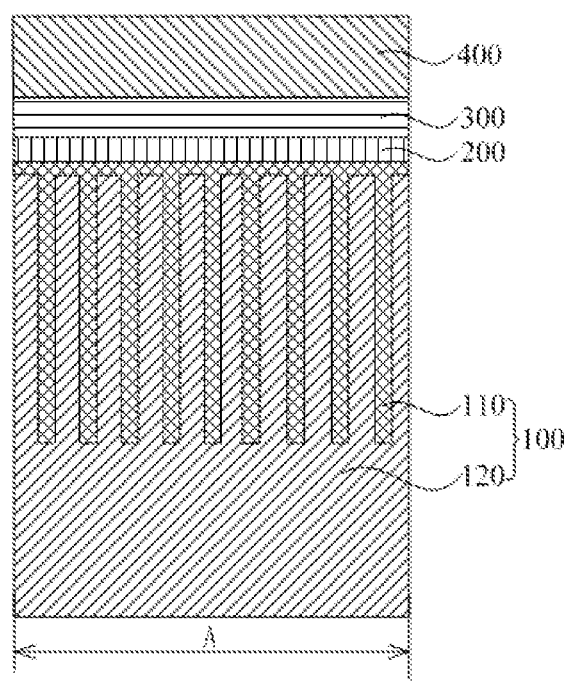
FIG. 11 is a cross-sectional view of a second cross-section in a core region after a second photoresist layer is formed in the related art.
Figure 12:
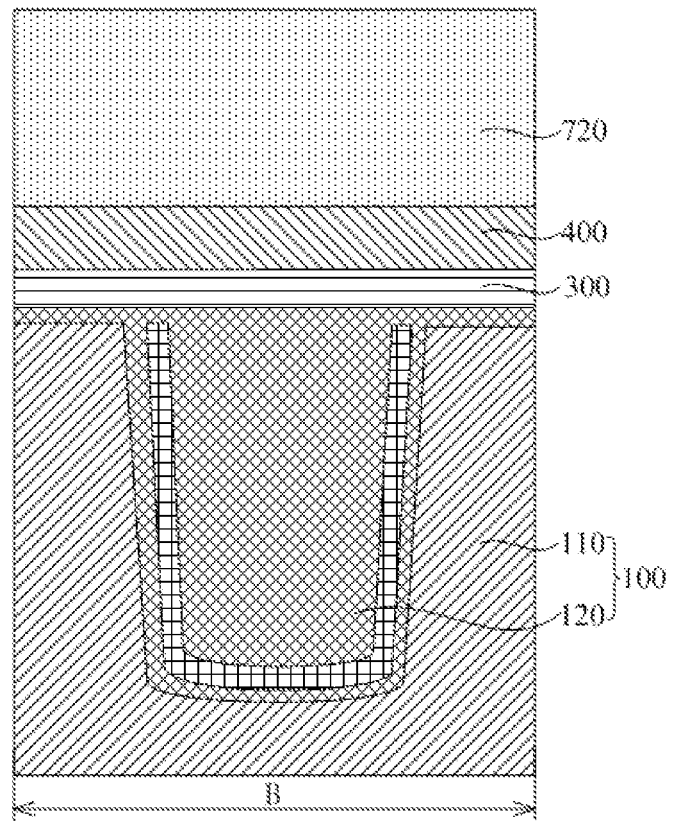
FIG. 12 is a cross-sectional view of a second cross-section in a peripheral region after a second photoresist layer is formed in the related art.
Figure 13:
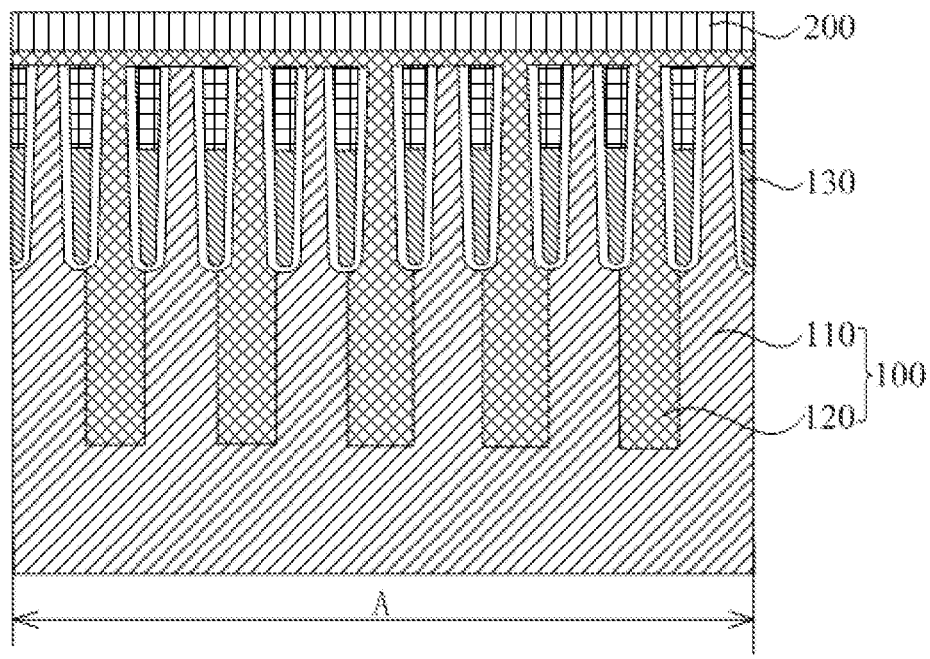
FIG. 13 is a cross-sectional view of a first cross-section in the core region after a dielectric layer and a first conductive layer corresponding to a core region are removed in the related art.
Figure 14:
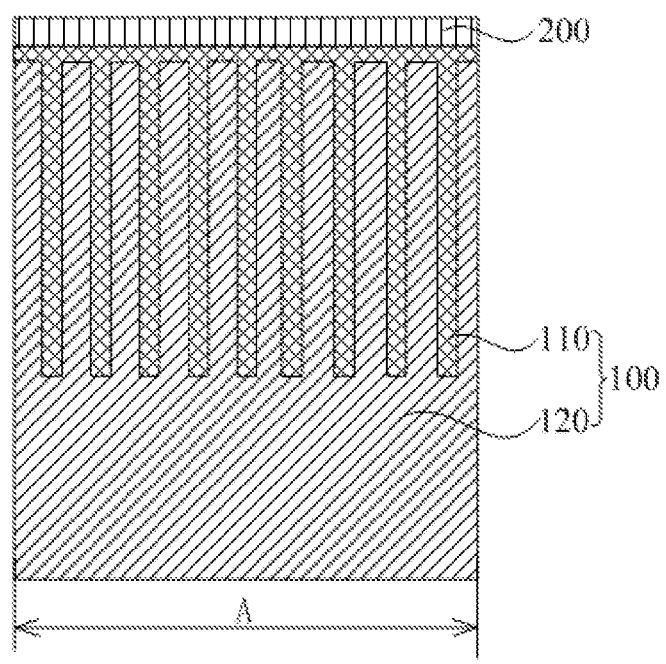
FIG. 14 is a cross-sectional view of a second cross-section in a core region after a dielectric layer and a first conductive layer corresponding to a core region are removed in the related art.
Figure 15:
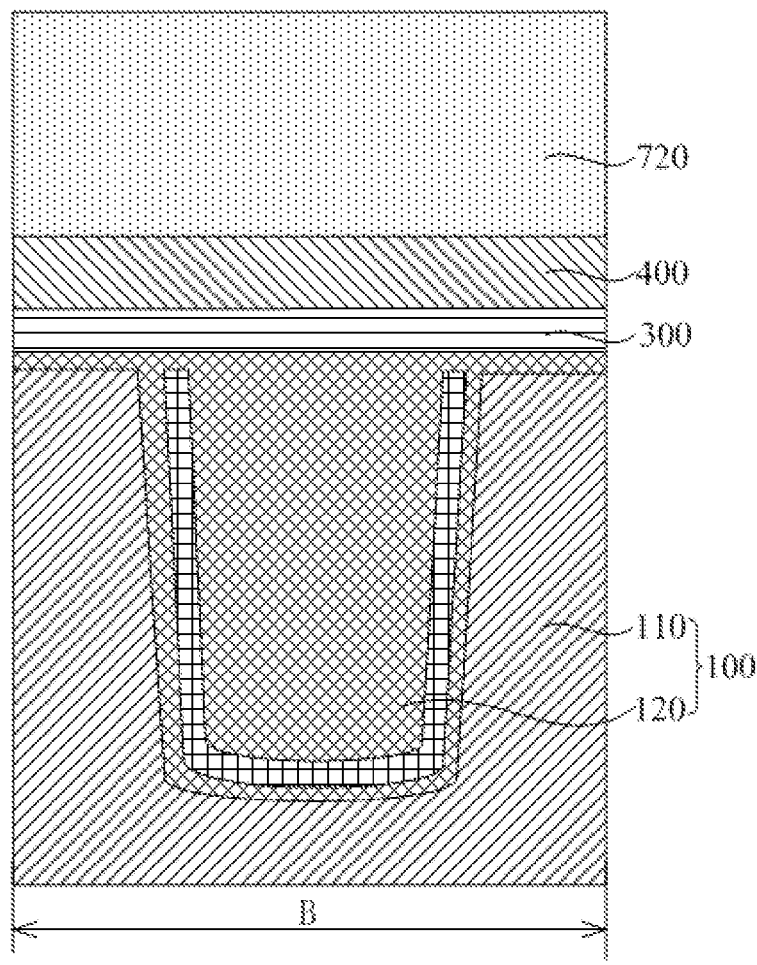
FIG. 15 is a cross-sectional view of a second cross-section in a peripheral region after a dielectric layer and a first conductive layer corresponding to a core region are removed in the related art.

Referring to FIG. 1 to FIG. 16, when manufacturing a semiconductor structure, a substrate 100 is typically provided first. The substrate 100 includes a core region, and a peripheral region located outside the core region and adjacent to the core region. And a first barrier layer 200 is arranged on the substrate 100. As shown in FIG. 1 to FIG. 3, a first photoresist layer 710 is formed on the first barrier layer 200 corresponding to the core region, and covers the first barrier layer 200 in the core region shown in FIG. 1 and FIG. 2. The first barrier layer 200 in the peripheral region shown in FIG. 3 is exposed. As shown in FIG. 4 to FIG. 6, a portion of the first barrier layer 200 corresponding to the peripheral region is removed to reserve a portion of the first barrier layer 200 in the core region shown in FIG. 4 and FIG. 5. As shown in FIG. 7 to FIG. 9, a dielectric layer 300 and a first conductive layer 400 are successively deposited on the first barrier layer 200 corresponding to the core region and the substrate 100 corresponding to the peripheral region. The dielectric layer 300 covers the first barrier layer 200 in the core region shown in FIG. 7 and FIG. 8, and covers the substrate 100 in the peripheral region shown in FIG. 9. The first conductive layer 400 covers the dielectric layer 300. As shown in FIG. 10 to FIG. 12, a second photoresist layer 720 is formed on the first conductive layer 400 corresponding to the peripheral region, and the first conductive layer 400 in the core region shown in FIG. 10 and FIG. 11 is exposed. As shown in FIG. 13 to FIG. 15, the first conductive layer 400 and the dielectric layer 300 corresponding to the core region are removed, to reserve the first conductive layer 400 and the dielectric layer 300 covered by the second photoresist layer 720, and expose the first barrier layer 200 in the core region shown in FIG. 13 and FIG. 14.

Figure 16:
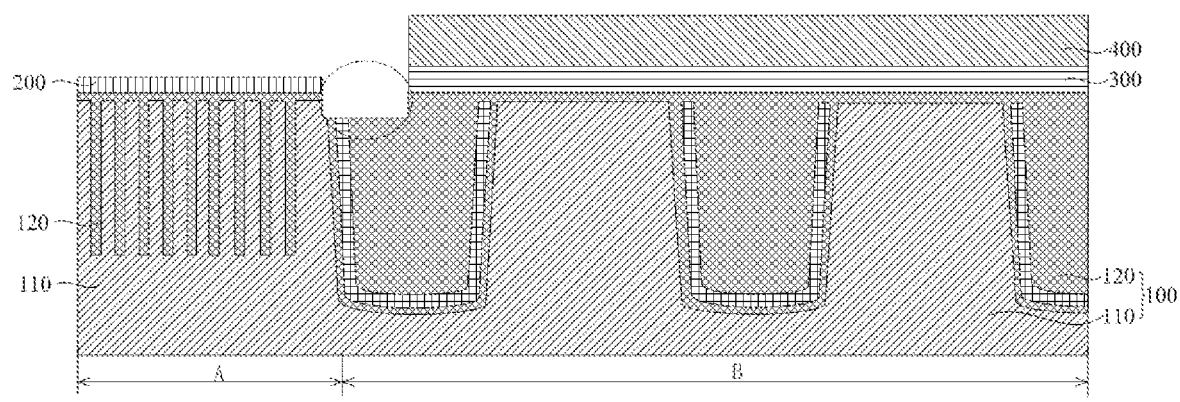
FIG. 16 is a schematic diagram of a junction region between a core region and a peripheral region in the related art.

However, referring to FIG. 16, during the above procedure of manufacturing the semiconductor structure, a fracture is liable to occur between the first barrier layer 200 corresponding to the core region and the dielectric layer 300 corresponding to the peripheral region, and part (for example, a dotted line region shown in FIG. 16) of the substrate 100 exposed to the fracture will be removed. Therefore, a device in the substrate 100 is liable to be exposed or even damaged, thereby resulting in a low yield of the semiconductor structure.

It is to be noted that in FIG. 1 to FIG. 16, a first cross-section is perpendicular to a second cross-section, the first cross-section is perpendicular to an extension direction of a word line 130, and the second cross-section is parallel to the extension direction of the word line 130. The first cross-section is located between two adjacent active areas 110, and the second cross-section passes through the center of the active area 110.

The embodiments of the present application provide a method for manufacturing a semiconductor. By forming the first barrier layer, and reserving a part of the dielectric layer and a part of the first conductive layer on the first barrier layer, a part of the region of the substrate covers the first barrier layer, a part of the region of the substrate covers the dielectric layer, and the first barrier layer partially overlaps the dielectric layer. Therefore, the exposed portion of the substrate is reduced, the risk of removing a part of the substrate will be reduced, and the risk of exposing or even damaging on the device in the substrate will be reduced.

In order that the above objects, features, and advantages of the embodiments of the present disclosure may be more readily understood, a clearer and more complete description of the technical solutions of the embodiments of the present disclosure will be made by reference to the drawings in the embodiments of the present disclosure. It is apparent that the described embodiments are only some, but not all the embodiments of the present disclosure. On the basis of the embodiments in the present disclosure, all other embodiments obtained by those skilled in the art without any creative effort fall within the protection scope of the present disclosure.

Figure 17:
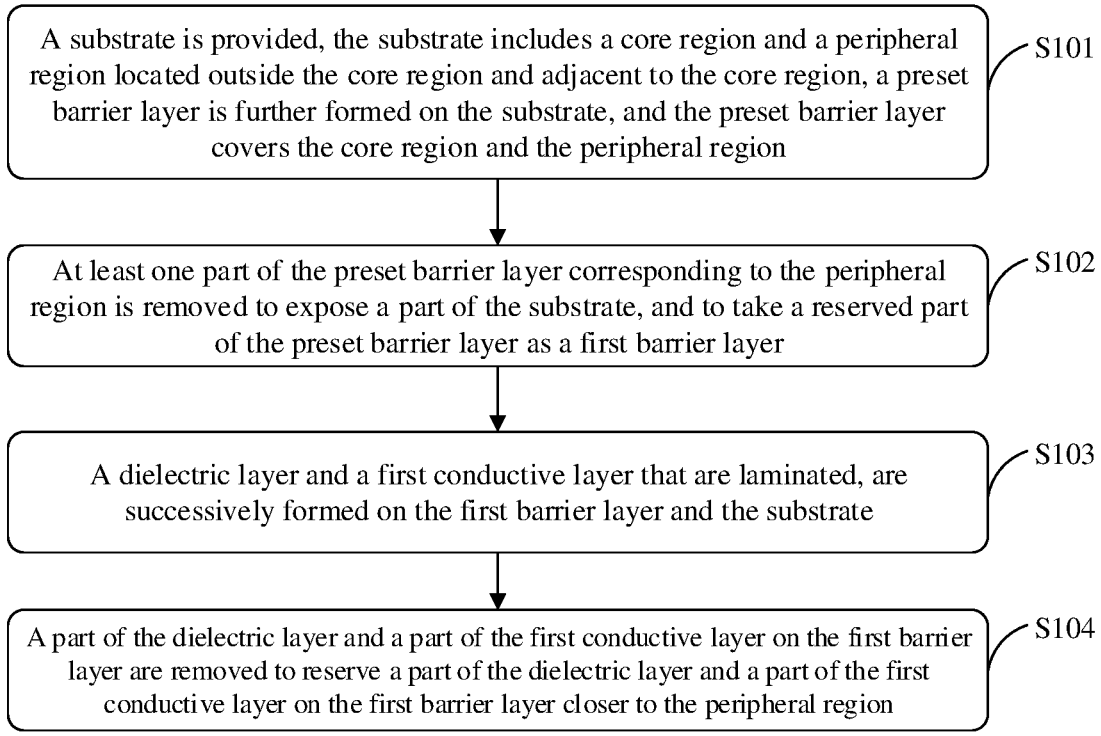
FIG. 17 is a flow chart of a method of manufacturing a semiconductor structure in an embodiment of the present disclosure.

Referring to FIG. 17, the embodiments of the present disclosure provide a method for manufacturing a semiconductor structure, including the following operations.

In S101, a substrate is provided. The substrate includes a core region and a peripheral region located outside the core region and adjacent to the core region. A preset barrier layer is further formed on the substrate, and covers the core region and the peripheral region.

Figure 18:
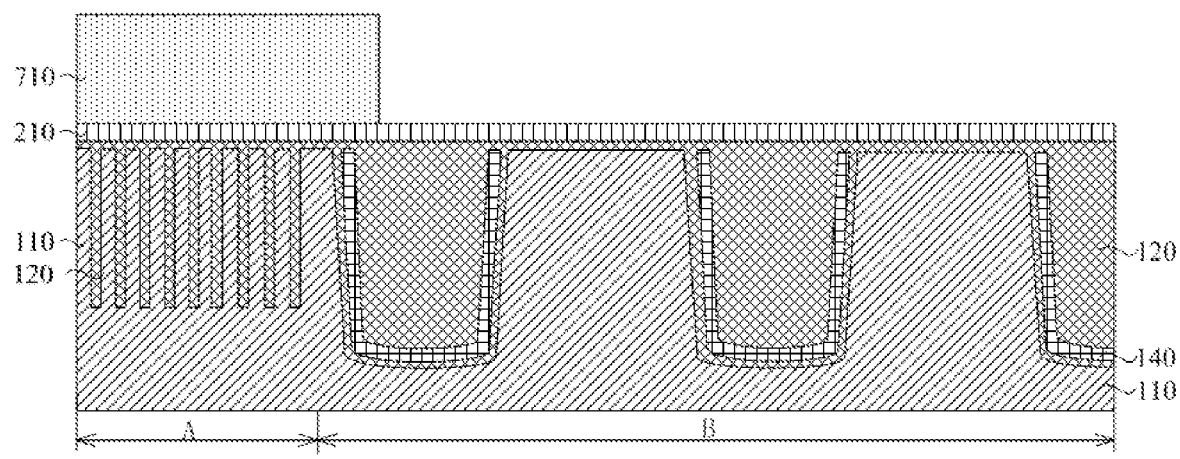
FIG. 18 is a cross-sectional view of a second cross-section after a first photoresist layer is formed in an embodiment of the present disclosure.
Figure 19:
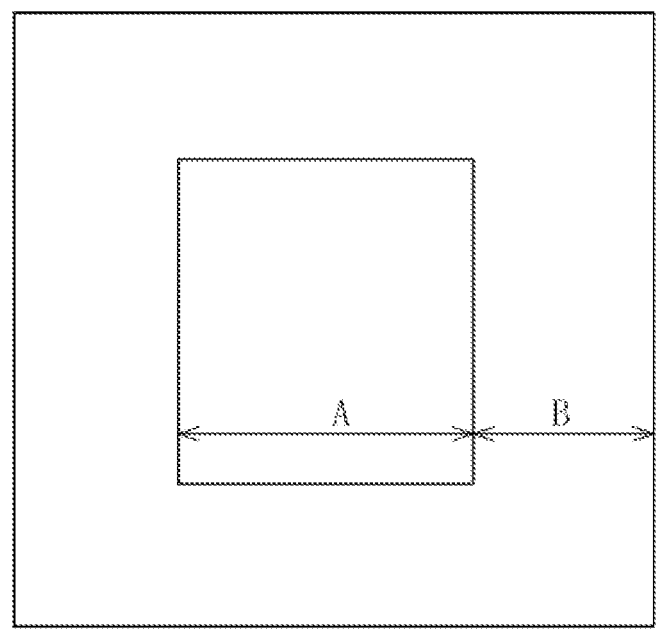
FIG. 19 is a top view of a substrate in an embodiment of the present disclosure.

Referring to FIG. 18 to FIG. 21, a substrate 100 includes a core region and a peripheral region. The core region and the peripheral region may be adjacent. The core region is a region A as shown in FIG. 18 to FIG. 21, and the peripheral region is a region B as shown as in FIG. 18 to FIG. 21. Exemplarily, as shown in FIG. 19, the peripheral region is arranged on a peripheral edge of the core region. That is, the peripheral region surrounds the core region.

An active area 110 is further typically arranged in the substrate 100. Referring to FIG. 18, a part of the active area 110 is located in the core region, and a part of the active area 110 is located in the peripheral region. The spacing between the active areas 110 located in the core region is relatively small, and the spacing between the active areas 110 in the peripheral region is relatively large. A shallow trench isolation structure 120 is arranged between the active areas 110, and the shallow trench isolation structure 120 is typically filled with an oxide (such as silicon oxide), so as to separate the active areas 110. As shown in FIG. 18, the active area 110 is further covered with the oxide, so as to avoid the exposure of the active area 110.

It is to be noted that, as shown in FIG. 18, the shallow trench isolation structure 120 in the peripheral region is further filled with a nitride layer 140, such as a silicon nitride layer. Exemplarily, a first groove is formed in the peripheral region of the substrate 100. A first oxide layer is deposited in the first groove, and delimits a second groove. The nitride layer 140 is deposited in the second groove, and delimits a third groove. A second oxide layer is deposited in the third groove, and fills up the third groove to form the shallow trench isolation structure 120.

Figure 20:
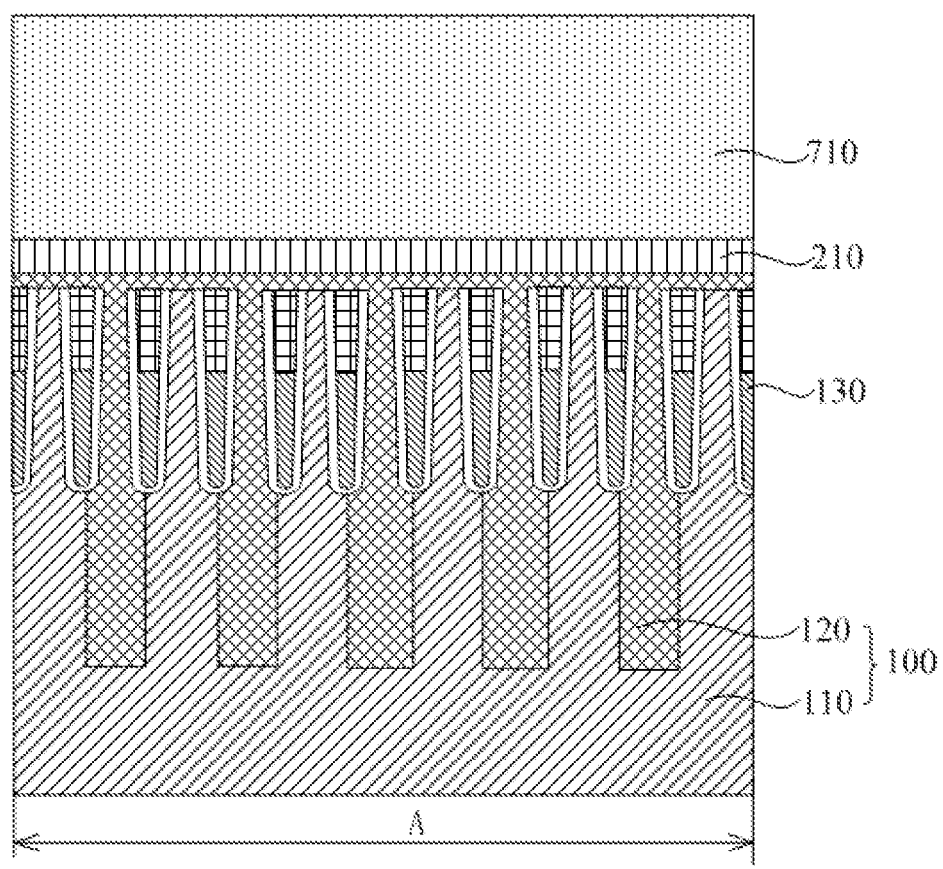
FIG. 20 is a cross-sectional view of a first cross-section in a core region after a first photoresist layer is formed in an embodiment of the present disclosure.
Figure 21:
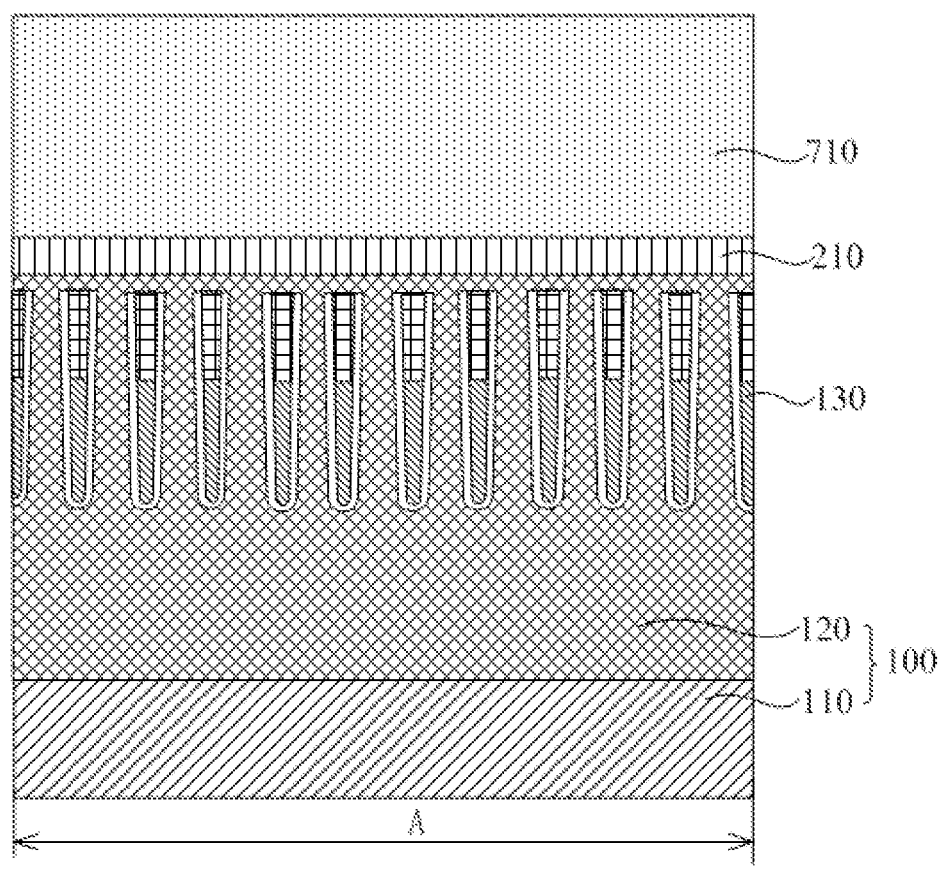
FIG. 21 is a cross-sectional view of a third cross-section in a core region after a first photoresist layer is formed in an embodiment of the present disclosure.
Figure 22:
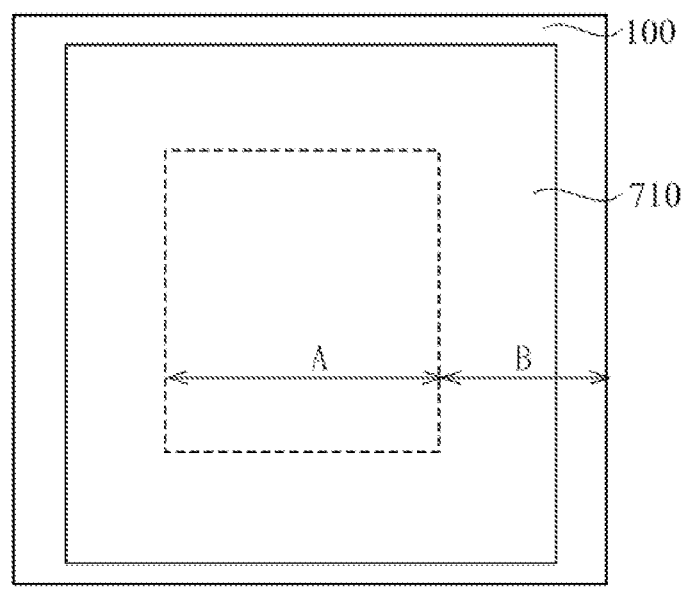
FIG. 22 is a top view of structure after a first photoresist layer is formed in an embodiment of the present disclosure.
Figure 23:
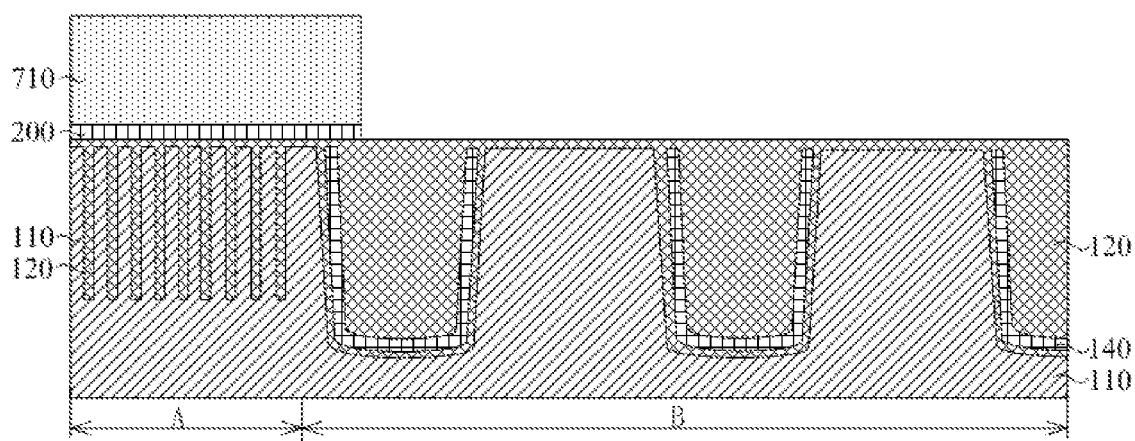
FIG. 23 is a cross-sectional view of a second cross-section after a part of a first barrier layer is removed in an embodiment of the present disclosure.
Figure 24:
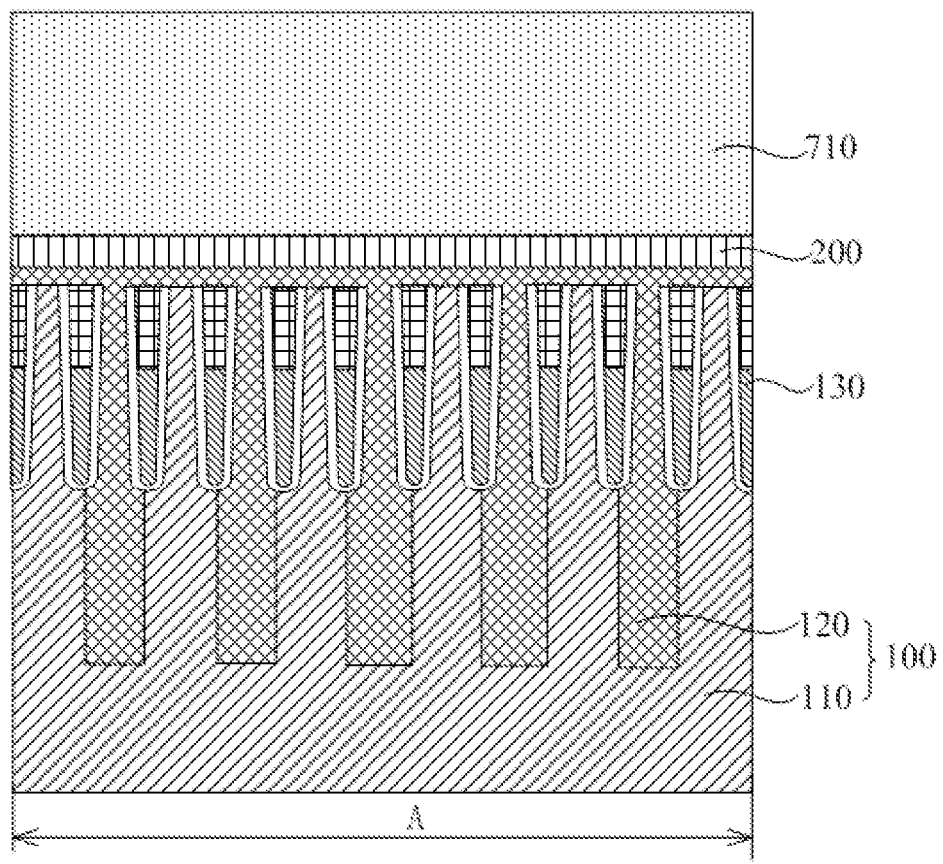
FIG. 24 is a cross-sectional view of a first cross-section in a core region after a part of a first barrier layer is removed in an embodiment of the present disclosure.
Figure 25:
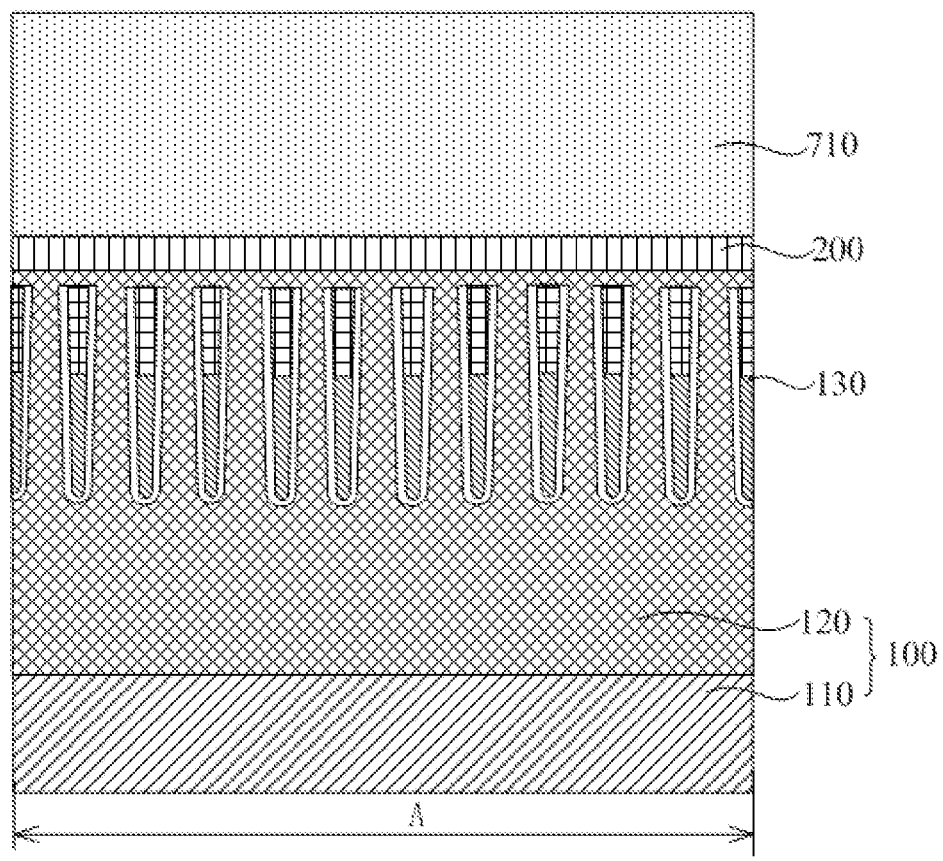
FIG. 25 is a cross-sectional view of a third cross-section in a core region after a part of a first barrier layer is removed in an embodiment of the present disclosure.

Referring to FIG. 20 and FIG. 21, a buried word line 130 is further typically arranged in the substrate 100. A cross-section shown in FIG. 18 is a cross-section parallel to an extension direction of the word line, and the cross-section passing through the center of the active area 110. That is, the cross-section shown in FIG. 18 is a second cross-section, and the cross-sections shown in FIG. 20 and FIG. 21 are cross-sections perpendicular to the extension direction of the word line and located at different positions in the extension direction of the word line. A first cross-section shown in FIG. 20 is parallel to a third cross-section shown in FIG. 21, the first cross-section shown in FIG. 20 is located at the center of two adjacent active areas 110, and the third cross-section shown in FIG. 21 passes through the center of the active area 110.

With continued reference to FIG. 18 to FIG. 21, a preset barrier layer 210 is arranged on the substrate 100. The preset barrier layer 210 covers the core region and the peripheral region of the substrate 100. Exemplarily, the material of the preset barrier layer 210 may be silicon nitride, and may have a thickness in a range of 200 nm to 600 nm.

The preset barrier layer 210 may be formed on the substrate 100 by a deposition process. For example, the preset barrier layer 210 may be formed on the substrate 100 by a Chemical Vapor Deposition (CVD) process, a Physical Vapor Deposition (PVD) process, or an Atomic Layer Deposition (ALD) process, and the like.

At S102, at least one part of the preset barrier layer corresponding to the peripheral region is removed to expose a part of the substrate, and to take the reserved part of the preset barrier layer as a first barrier layer.

Referring to FIG. 18 to FIG. 28, a part of the preset barrier layer 210 is removed to form the first barrier layer 200. For example, the preset barrier layer 210 corresponding to the peripheral region is removed to reserve the preset barrier layer 210 corresponding to the core region, form the first barrier layer 200 on the core region, and expose the peripheral region.

Alternatively, a part of the preset barrier layer 210, away from the core region, in the peripheral region is removed to expose a part of the substrate 100 in the peripheral region, the preset barrier layer 210 in the core region and a part of the peripheral region closer to the core region is reserved. That is, the reserved preset barrier layer 210 is partially located in the peripheral region and partially located in the core region. Exemplarily, the core region is located within an orthographic projection of the first barrier layer 200 on the substrate 100. For example, the core region is located in a central region of the orthographic projection.

In one possible example, the step that at least a part of the preset barrier layer 210 corresponding to the peripheral region is removed to expose a part of the substrate 100 and to take the reserved preset barrier layer 210 as the first barrier layer 200 includes the following operations.

As shown in FIG. 18 to FIG. 21, a first photoresist layer 710 is formed on the preset barrier layer 210. The first photoresist layer 710 covers at least the preset barrier layer 210 corresponding to the core region. The first photoresist layer 710 may cover only the core region. Alternatively, as shown in FIG. 18 to FIG. 21, the first photoresist layer 710 covers the core region and extends to the peripheral region.

As shown in FIG. 22 to FIG. 25, the preset barrier layer 210 is etched by taking the first photoresist layer 710 as a mask, so as to take the reserved part of the preset barrier layer that is etched as the first barrier layer 200. The preset barrier layer 210 covered by the first photoresist layer 710 is reserved to form the first barrier layer 200, and the preset barrier layer 210 uncovered by the first photoresist layer 710 is removed to expose the substrate 100. The first barrier layer 200 covers at least the core region. Referring to a top view shown in FIG. 22, the first barrier layer 200 is located below the first photoresist layer 710, and the first barrier layer 200 covers the core region and the peripheral region located at the edge of the core region.

Figure 26:
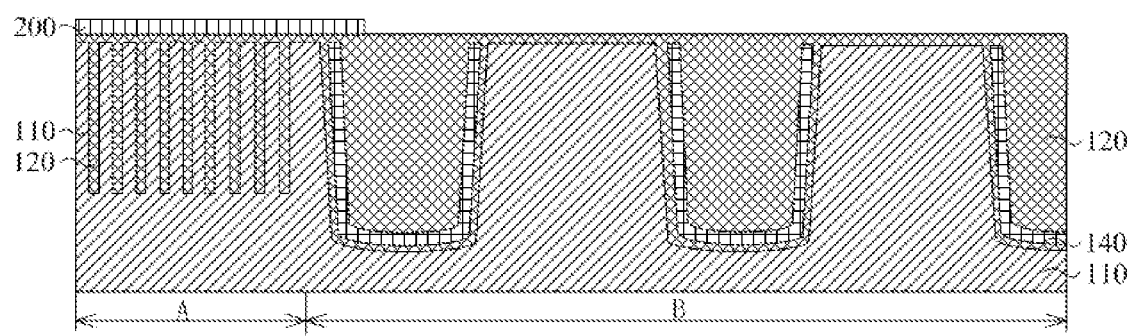
FIG. 26 is a cross-sectional view of a second cross-section after a first photoresist layer is removed in an embodiment of the present disclosure.
Figure 27:
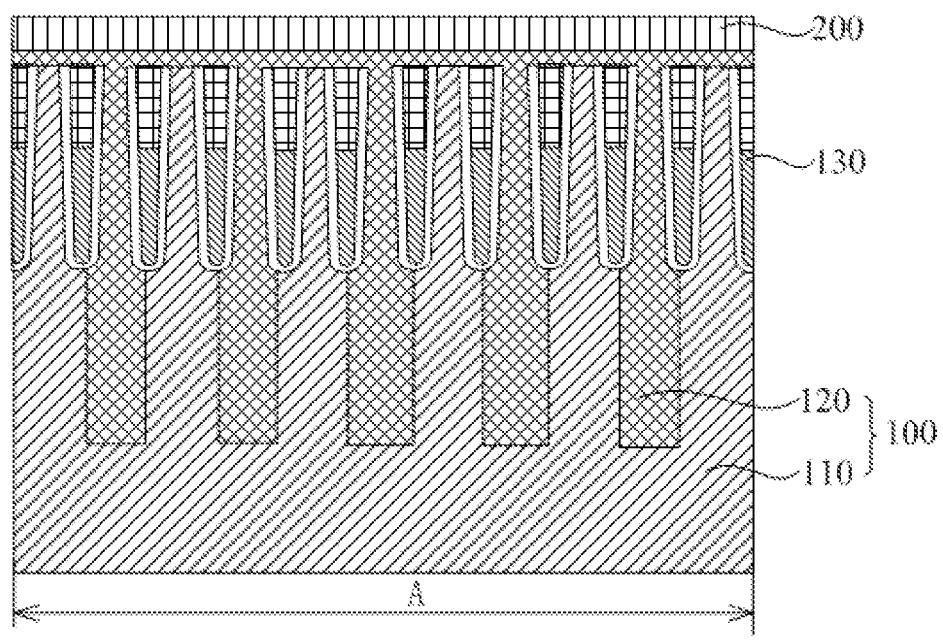
FIG. 27 is a cross-sectional view of a first cross-section in a core region after a first photoresist layer is removed in an embodiment of the present disclosure.
Figure 28:
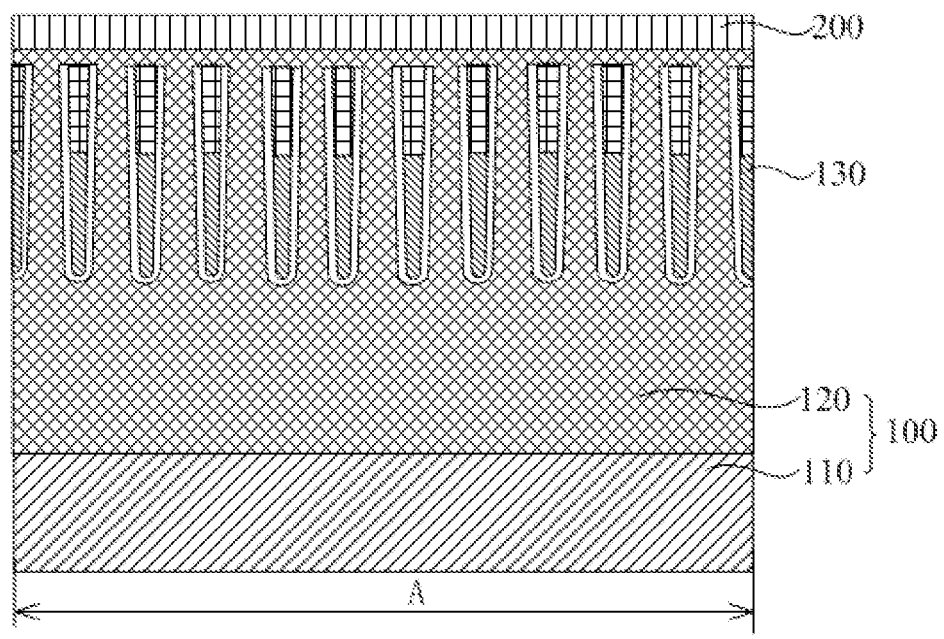
FIG. 28 is a cross-sectional view of a third cross-section in a core region after a first photoresist layer is removed in an embodiment of the present disclosure.

As shown in FIG. 26 to FIG. 28, the first photoresist layer 710 is removed. Ashing may be used to remove the first photoresist layer 710. After the first photoresist layer 710 is removed, the first barrier layer 200 is exposed.

At S103, a dielectric layer and a first conductive layer 4, which are laminated, are successively formed on the first barrier layer and the substrate.

Figure 29:
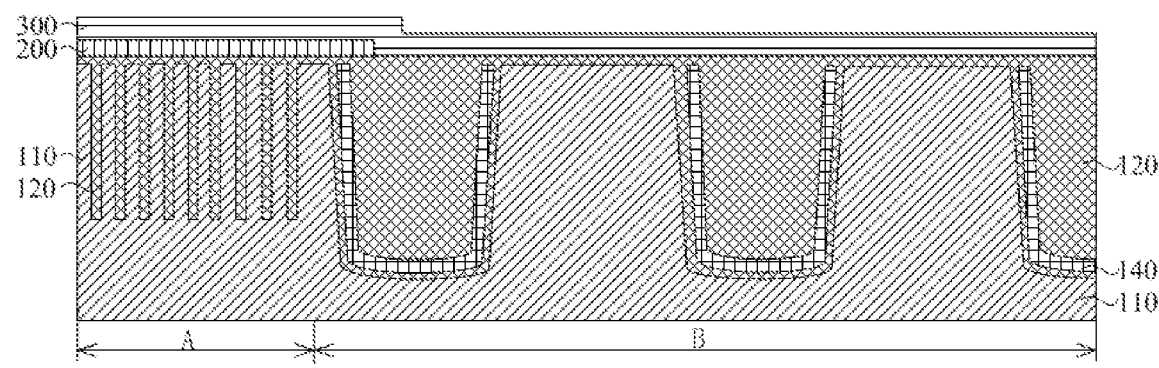
FIG. 29 is a cross-sectional view of a second cross-section after a dielectric layer is formed in an embodiment of the present disclosure.
Figure 30:
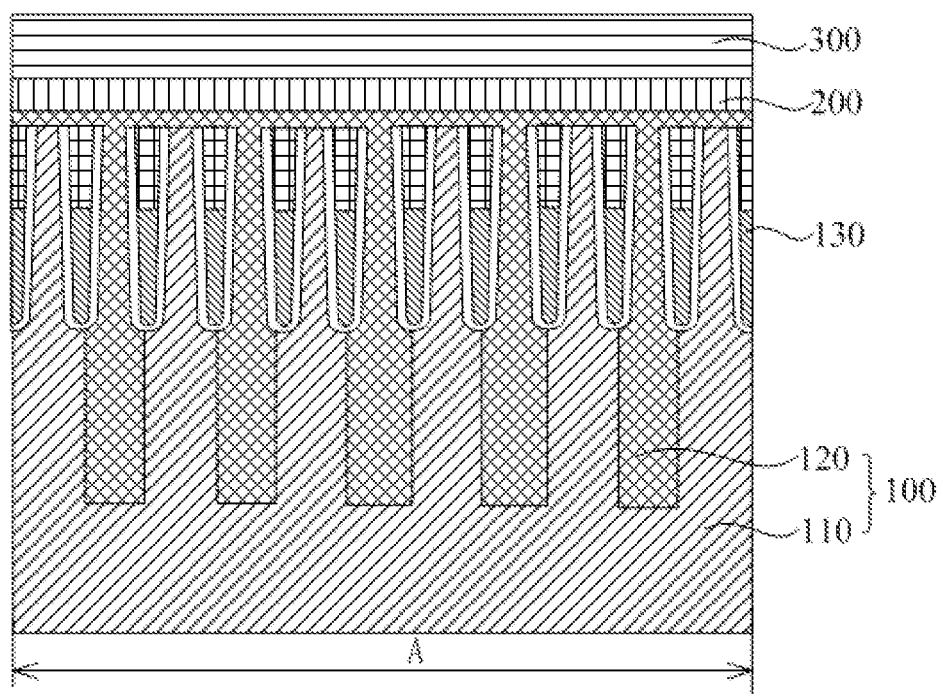
FIG. 30 is a cross-sectional view of a first cross-section in a core region after a dielectric layer is formed in an embodiment of the present disclosure.
Figure 31:
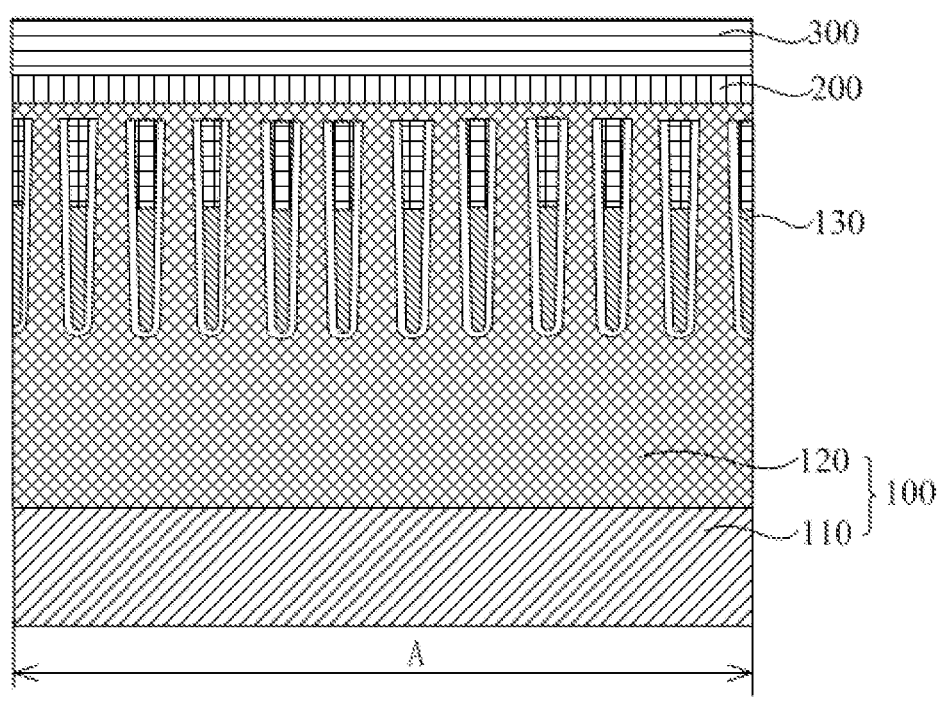
FIG. 31 is a cross-sectional view of a third cross-section in a core region after a dielectric layer is formed in an embodiment of the present disclosure.

Referring to FIG. 29 to FIG. 31, a dielectric layer 300 is deposited on the first barrier layer 200 and the exposed substrate 100, and the thickness of the dielectric layer 300 may be in a range of 50 nm to 200 nm. The dielectric layer 300 may have a relatively high dielectric constant, so that the insulativity of the layer is relatively good, and the breakdown voltage of a device containing the layer is increased. As shown in FIG. 29, a step may be formed between the dielectric layer 300 located on the first barrier layer 200 and the dielectric layer 300 located on the substrate 100.

Figure 32:
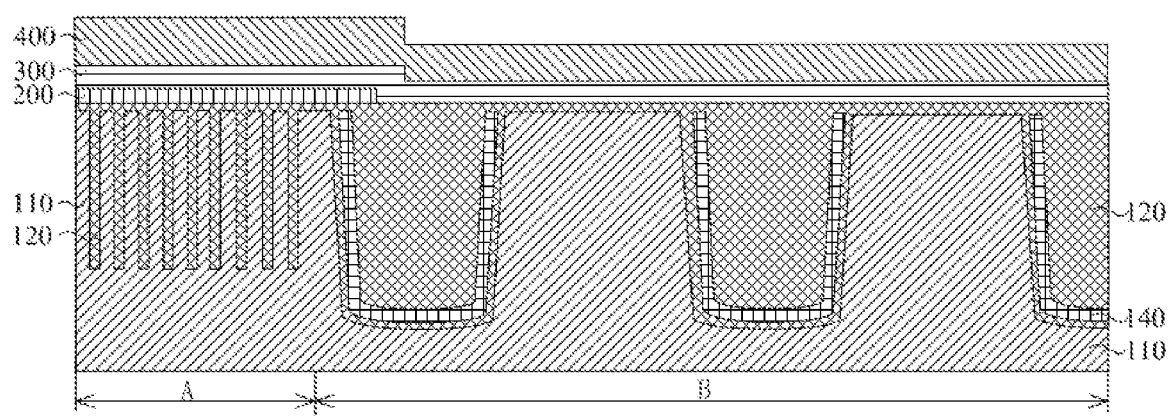
FIG. 32 is a cross-sectional view of a second cross-section after a first conductive layer is formed in an embodiment of the present disclosure.
Figure 33:
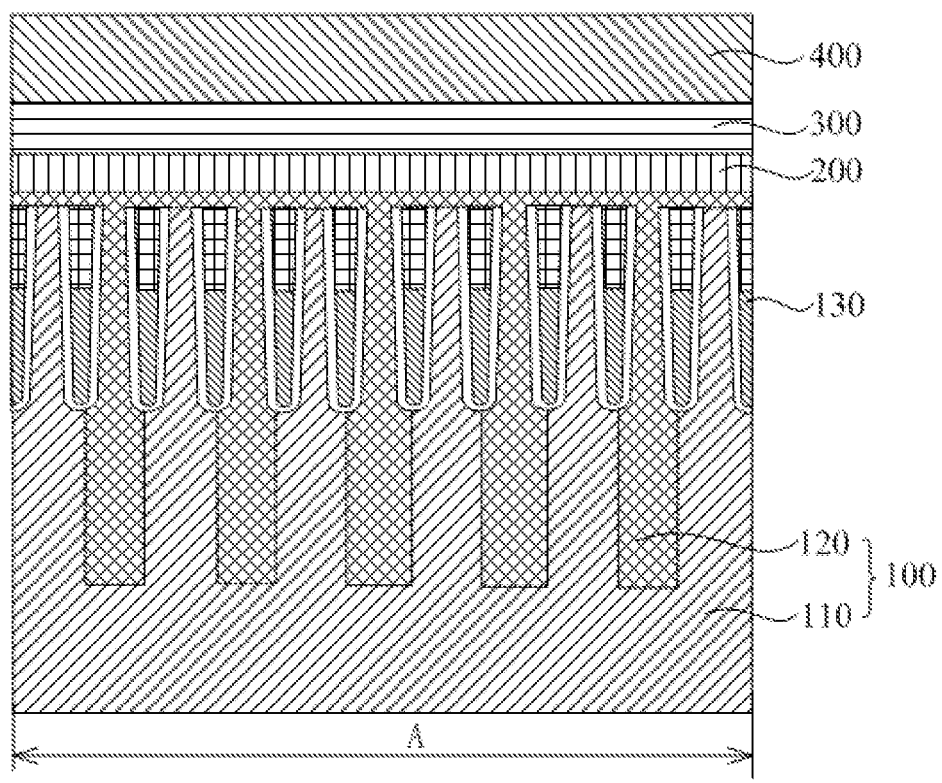
FIG. 33 is a cross-sectional view of a first cross-section in a core region after a first conductive layer is formed in an embodiment of the present disclosure.
Figure 34:
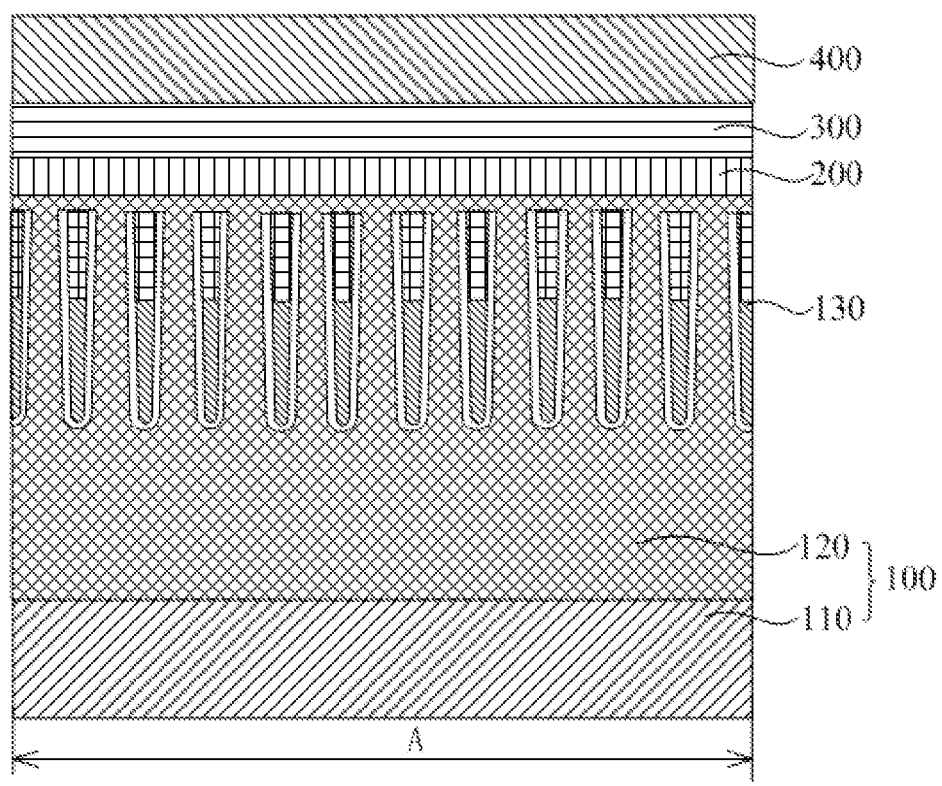
FIG. 34 is a cross-sectional view of a third cross-section in a core region after a first conductive layer is formed in an embodiment of the present disclosure.

Referring to FIG. 32 to FIG. 34, a first conductive layer 400 is deposited on the dielectric layer 300, and the thickness of the first conductive layer 400 may be in a range of 300 nm to 600 nm. As shown in FIG. 32, the part of the first conductive layer 400 corresponding to the first barrier layer 200 is higher than the other parts. The material of the first conductive layer 400 may be polycrystalline silicon.

At S104, a part of the dielectric layer and a part of the first conductive layer on the first barrier layer are removed, and a part of the dielectric layer and a part of the first conductive layer on the first barrier layer closer to the peripheral region are reserved.

Figure 39:
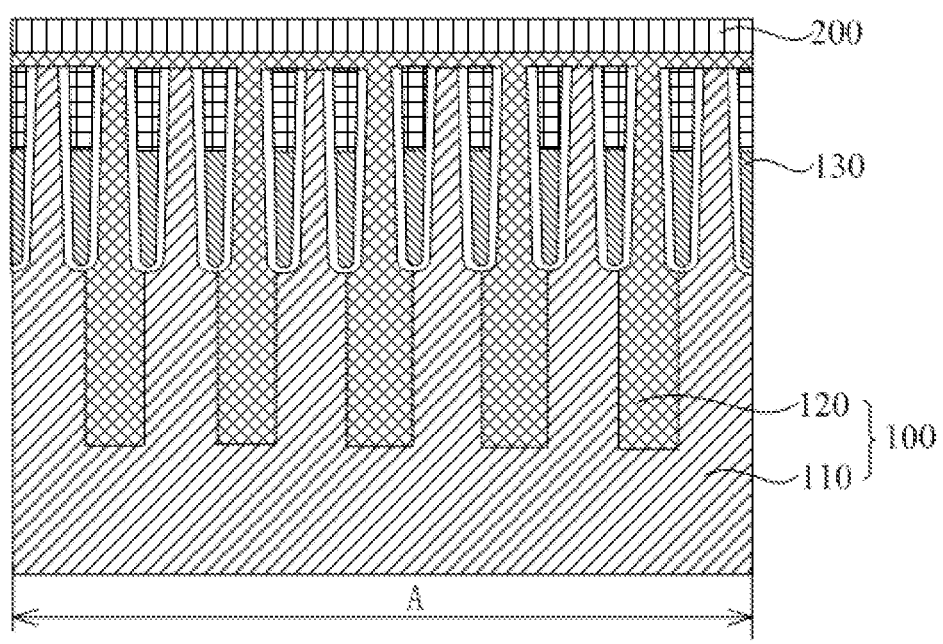
FIG. 39 is a cross-sectional view of a first cross-section in a core region after a part of a dielectric layer and a first conductive layer are removed in an embodiment of the present disclosure.
Figure 40:
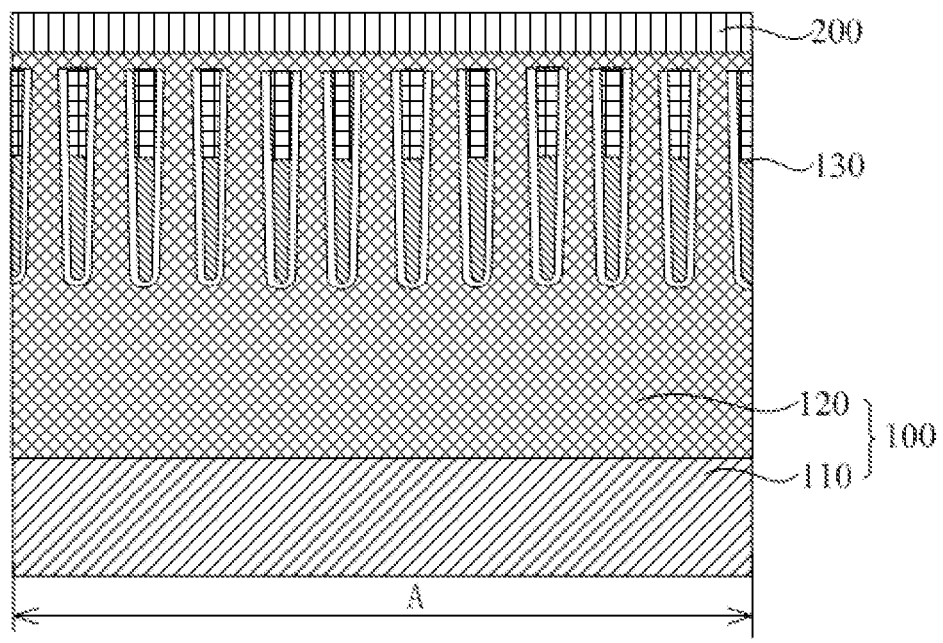
FIG. 40 is a cross-sectional view of a third cross-section in a core region after a part of a dielectric layer and a first conductive layer are removed in an embodiment of the present disclosure.
Figure 41:
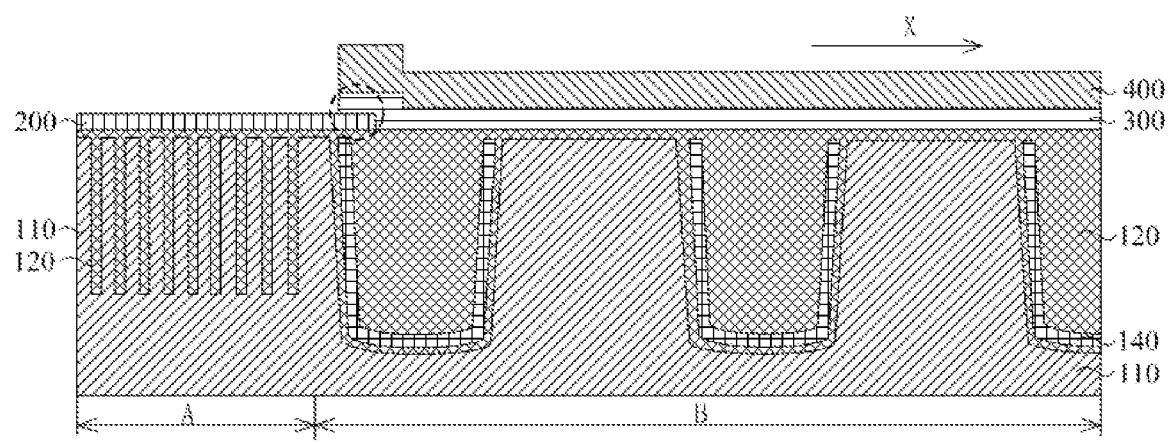
FIG. 41 is a cross-sectional view of a second cross-section after a second photoresist layer is removed in an embodiment of the present disclosure.

Referring to FIG. 35 to FIG. 44, a part of the dielectric layer 300 and a part of the first conductive layer 400 on the first barrier layer 200 away from the peripheral region are removed. Referring to FIG. 41, the orthographic projection of the dielectric layer 300 on the substrate 100 partially overlaps the orthographic projection of the first barrier layer 200 on the substrate 100 to form an overlapped region, and a width dimension of the overlapped region is in a range of 20 nm to 100 nm.

It will be appreciated that the dielectric layer 300 partially overlaps the first barrier layer 200, as shown by a dashed line in FIG. 41. The orthographic projection of the overlapped part on the substrate 100 is the overlapped region, and a dimension of the overlapped region in the horizontal direction (X-direction) is in a range of 20 nm to 100 nm.

Figure 42:
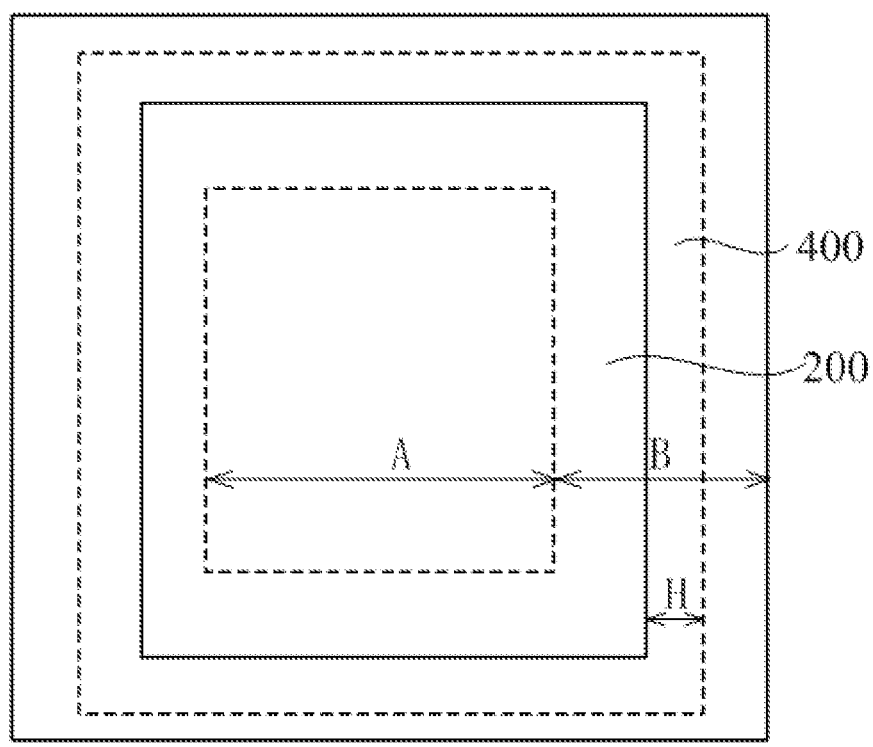
FIG. 42 is a top view after a second photoresist layer is removed in an embodiment of the present disclosure.
Figure 43:
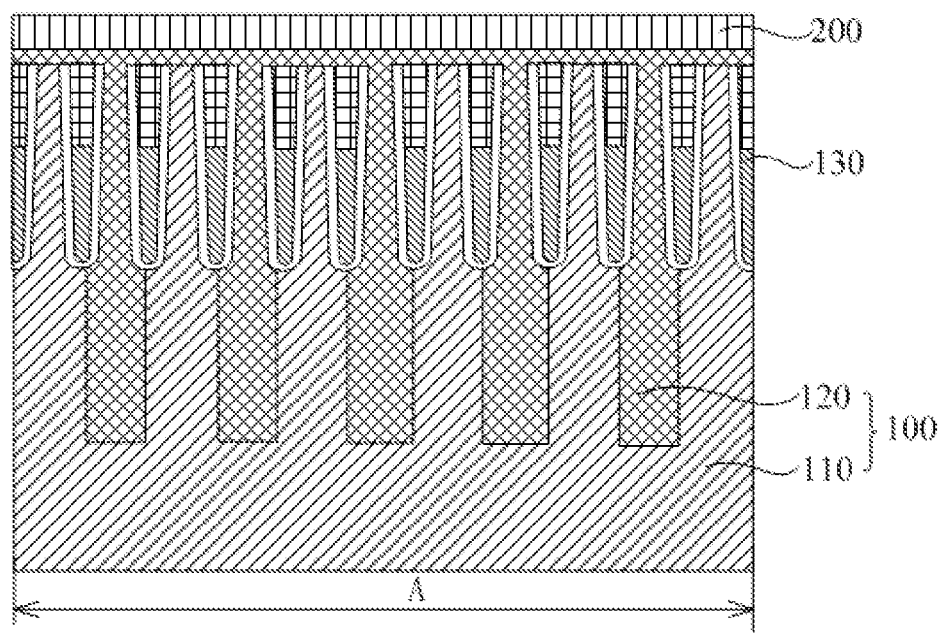
FIG. 43 is a cross-sectional view of a first cross-section in a core region after a second photoresist layer is removed in an embodiment of the present disclosure.
Figure 44:
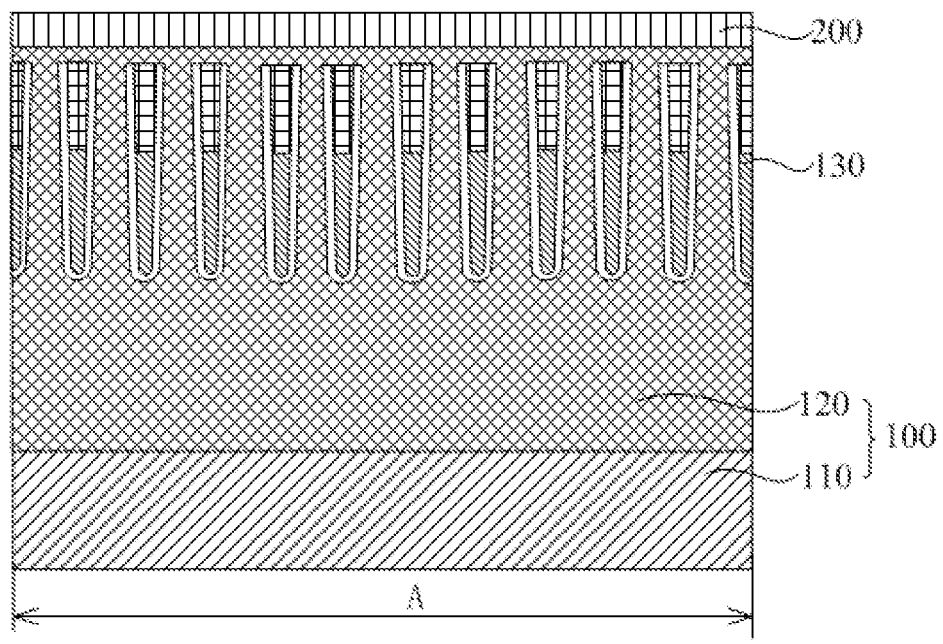
FIG. 44 is a cross-sectional view of a third cross-section in a core region after a second photoresist layer is removed in an embodiment of the present disclosure.

In one possible example, referring to a top view shown in FIG. 42, the overlapped region may be annular, and the overlapped region is at H as shown in FIG. 42. As shown in FIG. 42, a region enclosed by an inner dotted line is the core region, the region between the two nested solid lines is the orthographic projection of the dielectric layer 300 on the substrate 100, and the region enclosed by an outer dotted line is the orthographic projection of the first barrier layer 200 on the substrate 100.

A shape of the overlapped region fits with the shape of the core region. For example, the shape of the overlapped region is a square ring. The spacing between inner edge of the square ring and a corresponding outer edge may be equal, and the spacing is in a range of 20 nm and 100 nm.

Of course, the spacing between each inner edge of the square ring and a corresponding outer edge may also be different. That is, the spacing between a part of the inner edge and the corresponding outer edge in the square ring is greater than the spacing between the other part of the inner edge and the corresponding outer edge, and the spacing is in a range of 20 nm and 100 nm.

It will be appreciated that the dielectric layer 300 partially overlaps the first barrier layer 200, so as to prevent a part of the substrate 100 in the core region and/or the peripheral region from being removed due to exposure. That is, when removing the dielectric layer 300 and the first conductive layer 400, the substrate 100 is still covered by the first barrier layer 200, thereby preventing a part of the substrate 100 from being removed when removing the dielectric layer 300 and the first conductive layer 400.

In one possible example, the step that a part of the dielectric layer 300 and a part of the first conductive layer 400 on the first barrier layer 200 are removed, and a part of the dielectric layer 300 and a part of the first conductive layer 400 on the first barrier layer 200 closer to the peripheral region are reserved includes the following operations.

Figure 35:
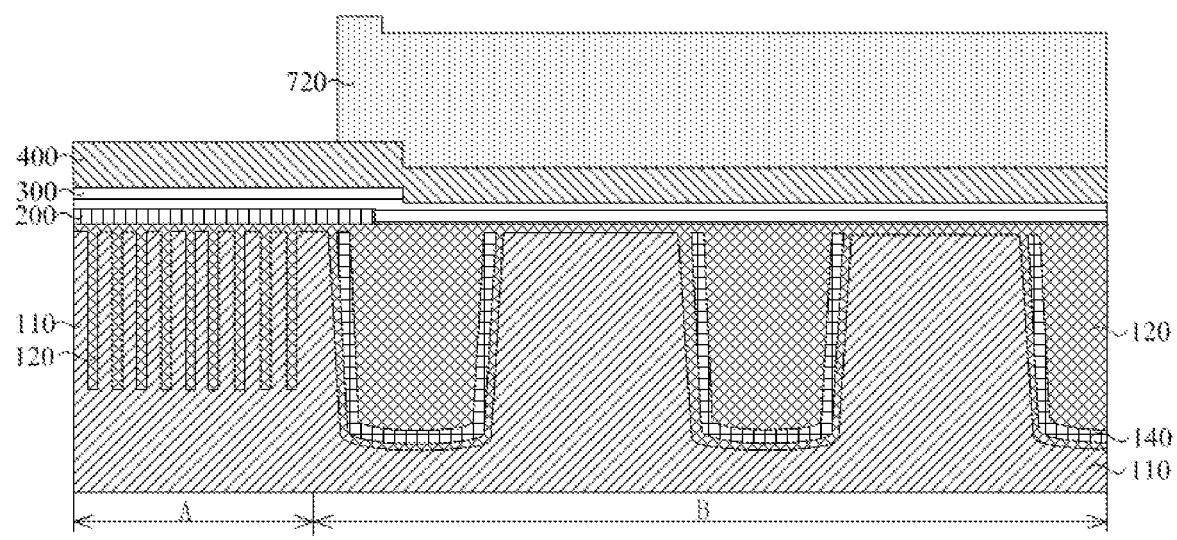
FIG. 35 is a cross-sectional view of a second cross-section after a first photoresist layer is formed in an embodiment of the present disclosure.
Figure 36:
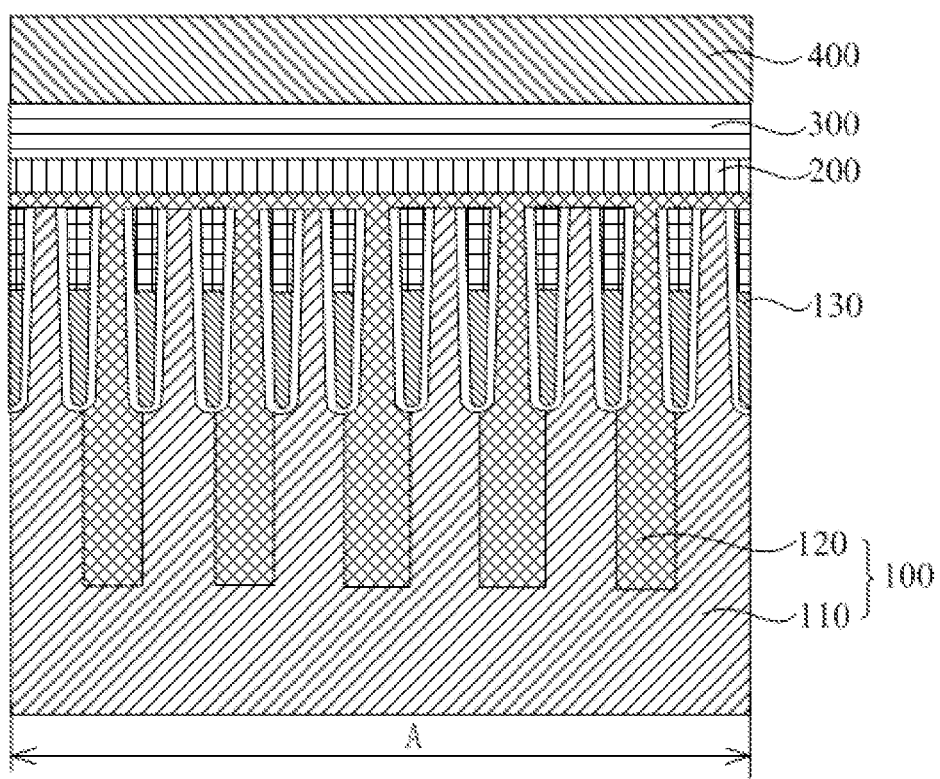
FIG. 36 is a cross-sectional view of a first cross-section in a core region after a first photoresist layer is formed in an embodiment of the present disclosure.
Figure 37:
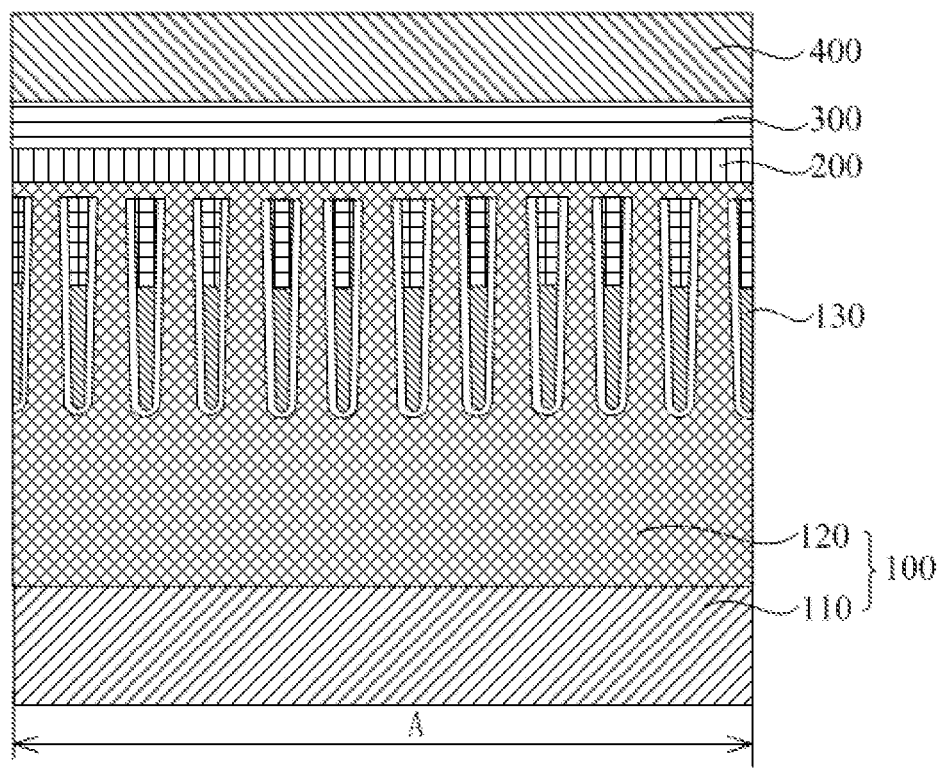
FIG. 37 is a cross-sectional view of a third cross-section in a core region after a first photoresist layer is formed in an embodiment of the present disclosure.

Referring to FIG. 35 to FIG. 37, a second photoresist layer 720 is formed on the first conductive layer 400, the orthographic projection of the second photoresist layer 720 on the substrate 100 partially overlaps the orthographic projection of the first barrier layer 200 on the substrate 100.

As shown in FIG. 35 to FIG. 37, the second photoresist layer 720 is deposited on the first conductive layer 400, and the second photoresist layer 720 partially overlaps the first conductive layer 400, so that the orthographic projection of the second photoresist layer 720 on the substrate 100 partially overlaps the orthographic projection of the first barrier layer 200 on the substrate 100. The dimension of the overlapped region of the orthographic projection of the second photoresist layer 720 on the substrate 100 and the orthographic projection of the first barrier layer 200 on the substrate 100 may be in a range of 20 nm to 100 nm.

It is to be noted that a surface, away from the substrate 100, of the second photoresist layer 720 may not be flush, and as shown in FIG. 35. An upper surface of the second photoresist layer 720 corresponding to the first barrier layer 200 may be higher than the upper surface of the second photoresist layer 720 in the other regions.

Figure 38:
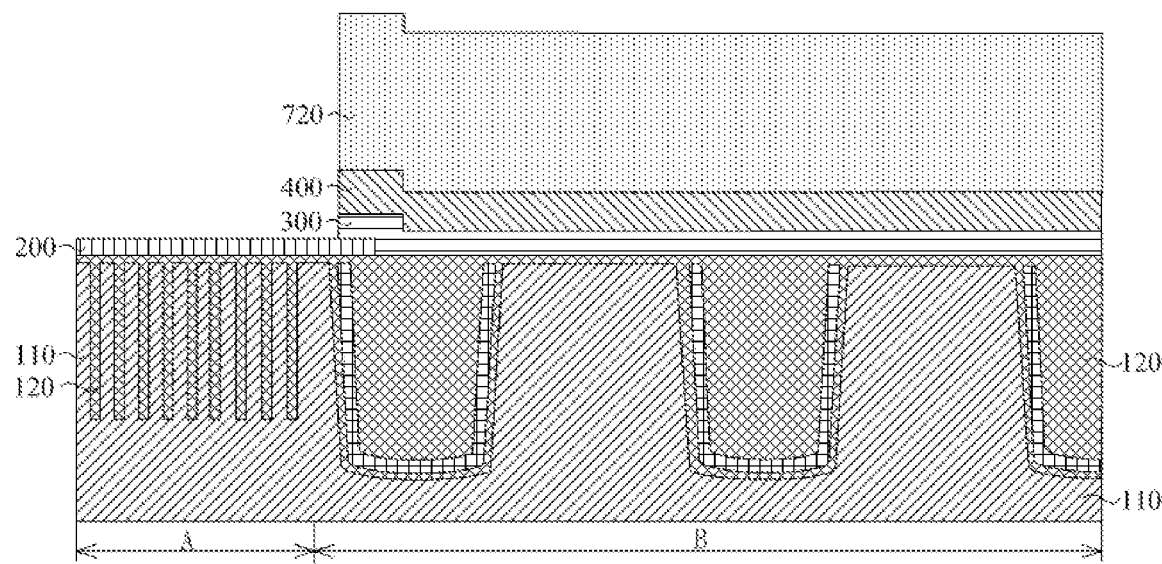
FIG. 38 is a cross-sectional view of a second cross-section after a part of a dielectric layer and a first conductive layer are removed in an embodiment of the present disclosure.

Referring to FIG. 38 to FIG. 40, the first conductive layer 400 and the dielectric layer 300 are etched by taking the second photoresist layer 720 as a mask, so as to expose the first barrier layer 200. As shown in FIG. 38 to FIG. 40, a part of the first conductive layer 400 and a part of the dielectric layer 300 shielded by the second photoresist layer 720 are reserved. The exposed parts of the first conductive layer 400 and the dielectric layer 300 are removed, and after etching, the first barrier layer 200 is exposed.

Referring to FIG. 41 to FIG. 44, the second photoresist layer 720 is removed. As shown in FIG. 41 to FIG. 44, after the second photoresist layer 720 is removed, the first conductive layer 400 is exposed, the dielectric layer 300 partially overlaps the first barrier layer 200, and the substrate 100 closer to a junction of the core region and the peripheral region is not exposed.

In the method for manufacturing a semiconductor structure provided by the embodiments of the present disclosure, a substrate 100 is provided, the substrate 100 including a core region, and a peripheral region located outside the core region and adjacent to the core region; a preset barrier layer 210 is further formed on the substrate 100, the preset barrier layer 210 covering the core region and the peripheral region; at least a part of the preset barrier layer 210 corresponding to the peripheral region is removed, so as to expose a part of the substrate 100, to take a reserved part of the preset barrier layer 210 as a first barrier layer 200; a dielectric layer 300 and a first conductive layer 400, which are laminated, are successively formed on the first barrier layer 200 and the substrate 100; and a part of the dielectric layer 300 and a part of the first conductive layer 400 on the first barrier layer 200 are removed, and a part of the dielectric layer 300 and a part of the first conductive layer 400 on the first barrier layer 200 closer to the peripheral region are reserved. By forming the first barrier layer 200, and reserving part of the dielectric layer 300 and a part of the first conductive layer 400 on the first barrier layer 200, a part of the region of the substrate 100 covers the first barrier layer 200, a part of the region of the substrate 100 covers the dielectric layer 300, and the first barrier layer 200 partially overlaps the dielectric layer 300, thus the exposure of the substrate is reduced, the risk of removing a part of the substrate 100 is reduced, and the risk of exposing or even damaging a device in the substrate 100 is reduced.

It is to be noted that, referring to FIG. 18 to FIG. 46, an active area 110 is further arranged in the substrate 100 in the embodiments of the present disclosure. after the step that a part of the dielectric layer 300 and a part of the first conductive layer 400 on the first barrier layer 200 are removed, and a part of the dielectric layer 300 and a part of the first conductive layer 400 on the first barrier layer 200 closer to the peripheral region are reserved, the method for manufacturing the semiconductor structure further includes the following operations.

Figure 45:
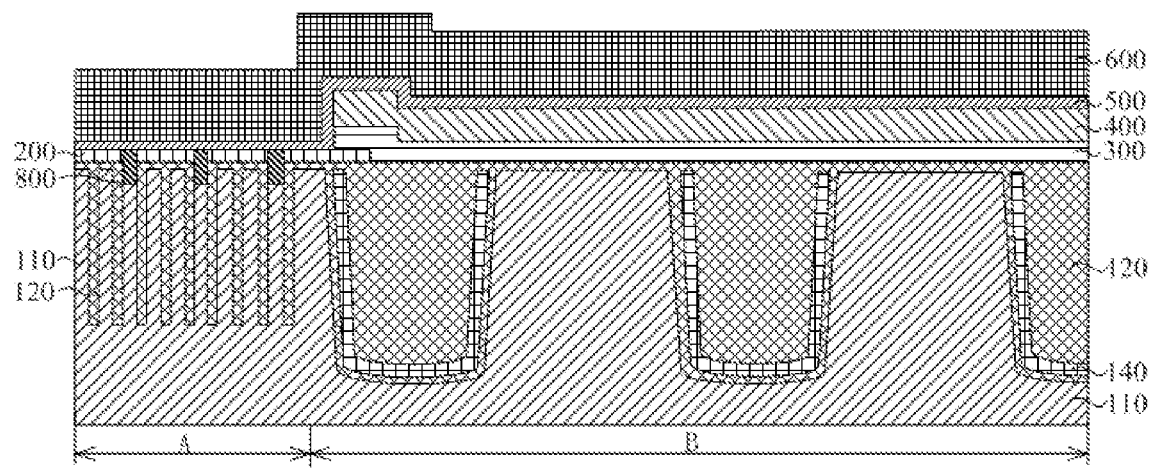
FIG. 45 is a cross-sectional view of a second cross-section after a third conductive layer and a second barrier layer are formed in an embodiment of the present disclosure.
Figure 46:
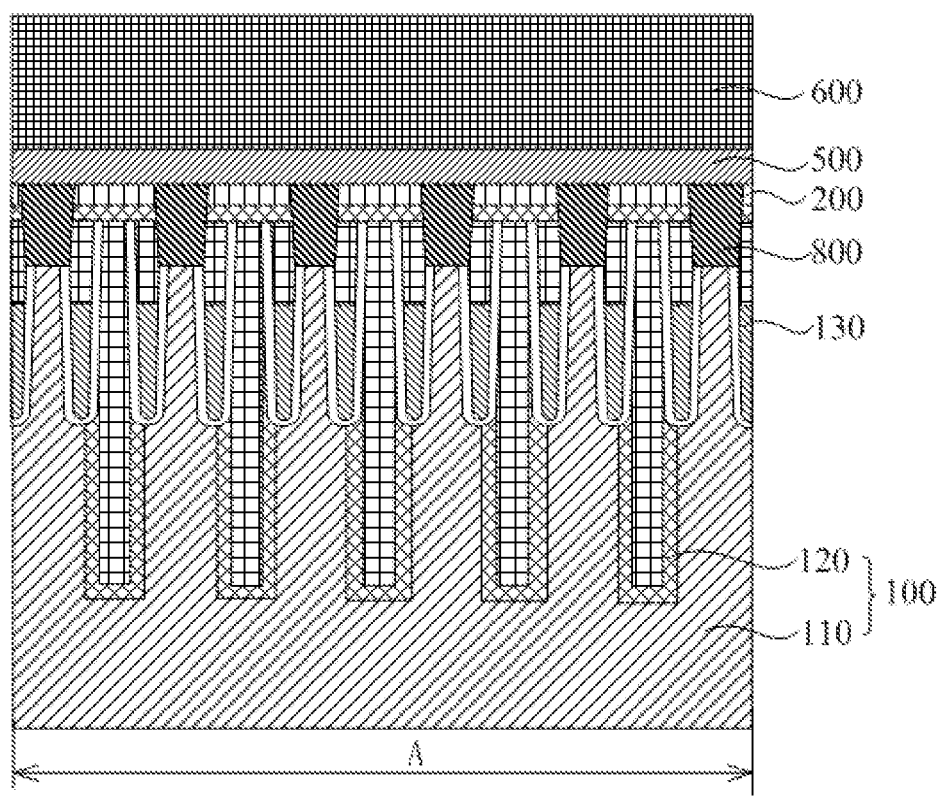
FIG. 46 is a cross-sectional view of a first cross-section in a core region after a third conductive layer and a second barrier layer are formed in an embodiment of the present disclosure.

A bit line contact hole is formed on the first barrier layer 200 and the substrate 100, and the bottom of the bit line contact hole exposes the active area 110 in the core region. As shown in FIG. 45 and FIG. 46, the first barrier layer 200 and the substrate 100 are etched, the bit line contact hole is formed in the first barrier layer 200 and the substrate 100, and the bit line contact hole exposes the active area 110.

After the bit line contact hole is formed on the first barrier layer 200 and the substrate 100, a second conductive layer 800 is formed in the bit line contact hole, and the second conductive layer 800 is flush with the first barrier layer 200. The second conductive layer 800 is deposited in the bit line contact hole, so that the second conductive layer 800 fills the bit line contact hole, so as to subsequently form bit line contact.

As shown in FIG. 45 and FIG. 46, the upper surface of the second conductive layer 800 is flush with the upper surface of the first barrier layer 200. That is, the surface of the second conductive layer 800 away from the substrate 100 is level with the surface, away from the substrate 100, of the first barrier layer 200, so that other film layers are formed on the second conductive layer 800 and the first barrier layer 200.

It is to be noted that when forming the second conductive layer 800, the first barrier layer 200 also has an oxide layer (not shown) thereon. The second conductive layer 800 is deposited in the bit line contact hole and deposited on the oxide layer (not shown). Chemical mechanical polishing is first performed on the second conductive layer 800 by taking the oxide layer (not shown) as a stop layer. When the second conductive layer 800 is polished to be flush with the oxide layer (not shown), the second conductive layer 800 is etched back, so that the upper surface of the second conductive layer 800 is flush with the first barrier layer 200, and then the oxide layer (not shown) is removed.

After the second conductive layer 800 is formed in the bit line contact hole, a third conductive layer 500 is formed on the first barrier layer 200, the second conductive layer 800 and the first conductive layer 400. The thickness of the third conductive layer 500 may be in a range of 50 nm to 200 nm.

Exemplarily, a titanium nitride layer is deposited on the first barrier layer 200, the second conductive layer 800, and the first conductive layer 400, and a tungsten layer is deposited on the titanium nitride layer. The titanium nitride layer and the tungsten layer constitute the third conductive layer 500. As shown in FIG. 45 and FIG. 46, the third conductive layer 500 covers the first barrier layer 200, the second conductive layer 800 and the first conductive layer 400.

It is to be noted that a metal layer (such as a cobalt (Co) layer or a titanium (Ti) layer) may be further arranged between the titanium nitride layer and the first conductive layer 400. That is, the metal layer is deposited on the first conductive layer 400 before the titanium nitride layer is formed. After the tungsten layer is deposited on the titanium nitride layer, an annealing treatment is performed, so that the first conductive layer 400 reacts with the metal layer to form ohmic contact of a metal compound (such as a metal silicide), thereby reducing the interface resistance, and improving the performance of the semiconductor structure.

After the third conductive layer 500 is formed on the first barrier layer 200, the second conductive layer 800, and the first conductive layer 400, a second barrier layer 600 is formed on the third conductive layer 500. With continued reference to FIG. 45 and FIG. 46, the second barrier layer 600 is deposited on the third conductive layer 500, and the material of the second barrier layer 600 may be silicon nitride. As shown in FIG. 45 and FIG. 46, the second barrier layer 600 covers the third conductive layer 500.

It is to be noted that, as shown in FIG. 45, there is a height difference between the first barrier layer 200 and the first conductive layer 400. After the third conductive layer 500 and the second barrier layer 600 are deposited, the surface, away from the substrate 100, of the second barrier layer 600 is not flush.

Figure 47:
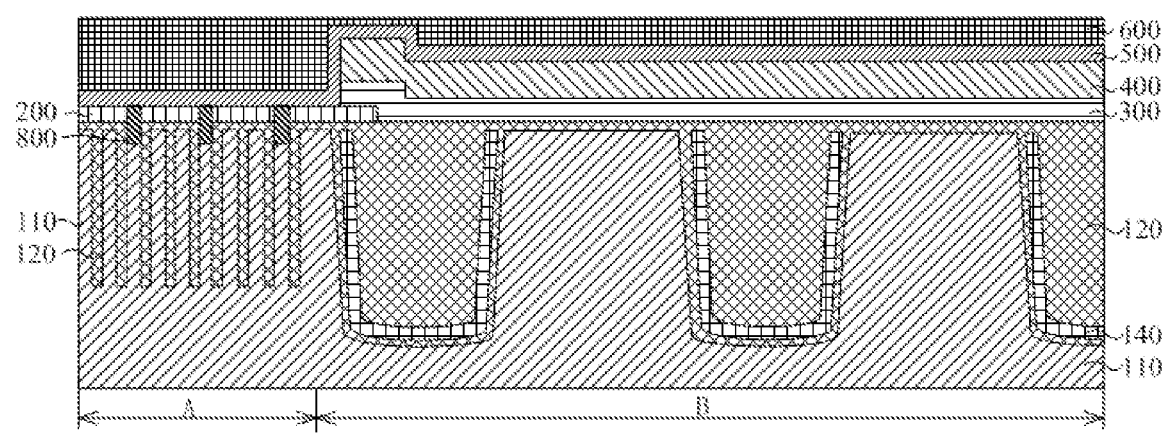
FIG. 47 is a cross-sectional view of a second cross-section after planarization treatment in an embodiment of the present disclosure.
Figure 48:
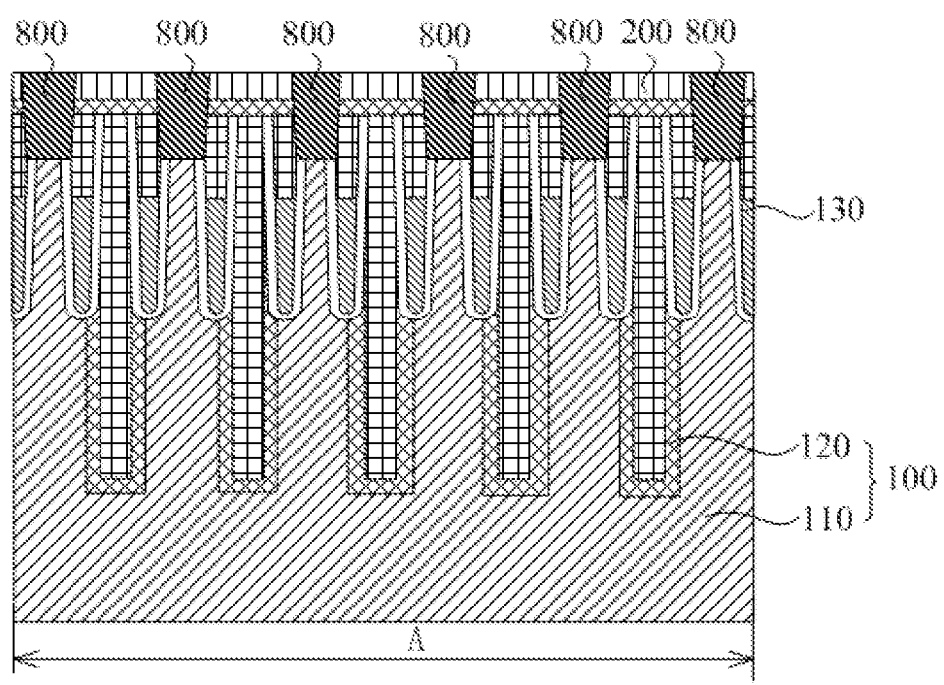
FIG. 48 is a cross-sectional view of a first cross-section in a core region after planarization treatment in an embodiment of the present disclosure.

Referring to FIG. 47 and FIG. 48, after the step that the second barrier layer 600 is formed on the third conductive layer 500, a planarization treatment is performed on the surface, away from the substrate 100, of the second barrier layer 600. The second barrier layer 600 on which the planarization treatment is performed, does not expose the third conductive layer 500.

Exemplarily, the planarization treatment on the surface, away from the substrate 100, of the second barrier layer 600 is performed by Chemical Mechanical Polishing (CMP), so as to obtain a relatively smooth surface. As shown in FIG. 47, the second barrier layer 600 corresponding to the core region is flush with the second barrier layer 600 corresponding to the peripheral region, and the second barrier layer 600 covers the third conductive layer 500.

As shown in FIG. 47, a second conductive layer 800 is arranged on the substrate 100 in the core region, and may subsequently form bit line contact. The third conductive layer 500 and the second barrier layer 600 are successively arranged on the substrate 100 in the core region. The third conductive layer 500 corresponding to the core region may subsequently form a bit line, and the second barrier layer 600 corresponding to the core region may subsequently form an isolation structure of the bit line.

As shown in FIG. 47, the dielectric layer 300, the third conductive layer 500 and the second barrier layer 600 are successively formed on the substrate 100 in the peripheral region. The dielectric layer 300, the third conductive layer 500 and the active area 110 in the substrate 100 may subsequently form a device, such as a transistor, and the second barrier layer 600 corresponding to the peripheral region subsequently forms the isolation structure of the device. The dielectric layer 300 may have a high dielectric constant (high-k), for example, the material of the dielectric layer 300 may include hafnium oxide, silicon-doped hafnium oxide, silicon-doped zirconium oxide, and the like, so that the device has relatively high breakdown voltage.

Figure 49:
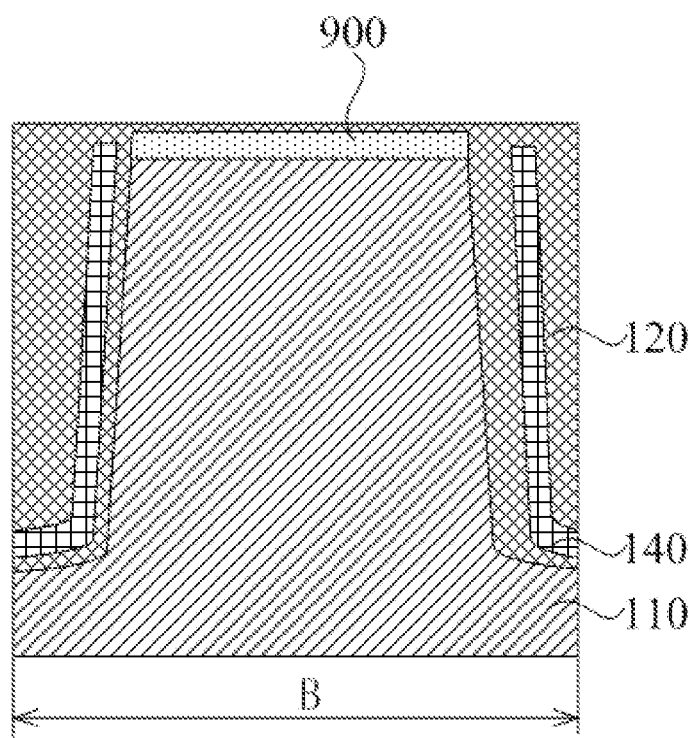
FIG. 49 is a schematic diagram of an epitaxial layer in an embodiment of the present disclosure.

It is to be noted that, with reference to FIG. 49, after the step that a part of the dielectric layer 300 and a part of the first conductive layer 400 on the first barrier layer 200 are reserved, and a part of the dielectric layer 300 and a part of the first conductive layer 400 on the first barrier layer 200 closer to the peripheral region are reserved, the method for manufacturing a semiconductor structure further includes the following operations. An epitaxial layer 900 is epitaxially grown in a part of the active area 110 in the peripheral region. The epitaxial layer 900 contains a preset metal.

As shown in FIG. 49, the epitaxial layer 900 is formed in a part of the active area 110 located in the peripheral region. For example, the epitaxial layer 900 is formed in the active area 110 by processes such as epitaxial growth, and the like. The epitaxial layer 900 contains the preset metal.

The material of the epitaxial layer 900 may be the same as the material of the active area 110. For example, the material of both the active area 110 and the epitaxial layer may be silicon, and the epitaxial layer 900 may contain germanium. Of course, the material of the active area 110 and the material of the epitaxial layer 900 are not limited. The material of the epitaxial layer 900 may be different from the material of the active area 110, and the preset metal may be germanium or other metals.

In some possible examples, the epitaxial layer 900 is not arranged in a part of the active area 110, and an NMOS is subsequently formed in the part of the active area 110. The epitaxial layer 900 is arranged in a part of the active area 110, and a PMOS is subsequently formed in the part of the active area 110.

Referring to FIG. 47, the embodiments of the present disclosure provide a semiconductor structure. The semiconductor structure includes a substrate 100, a first barrier layer 200, a dielectric layer 300, and a first conductive layer 400. The substrate 100 includes a core region and a peripheral region. The core region and the peripheral region may be adjacent. The core region is a region A shown in FIG. 46, and the peripheral region is a region B shown in FIG. 46. Exemplarily, the peripheral region is arranged at a peripheral edge of the core region. That is, the peripheral region surrounds the core region.

An active area 110 is further typically arranged in the substrate 100. Referring to FIG. 46, a part of the active area 110 is located in the core region, and a part of the active area 110 is located in the peripheral region. The spacing between the active areas 110 located in the core region is relatively small, and the spacing between the active areas 110 located in the peripheral region is relatively large. A shallow trench isolation structure 120 is arranged between the active areas 110, the shallow trench isolation structure 120 is typically filled with an oxide (such as silicon oxide), so as to separate the active areas 110. As shown in FIG. 46, the active area 110 is further covered with the oxide, so as to avoid the exposure of the active area 110.

With continued reference to FIG. 46, a buried word line 130 is further typically arranged in the substrate 100. A second cross-section shown in FIG. 46 is a plane parallel to an extension direction of the word line 130 and passes through the center of the active area 110. A first barrier layer 200 is further arranged on the substrate 100, and the first barrier layer 200 covers at least the core region. The first barrier layer 200 may be arranged in the core region of the substrate 100, or the first barrier layer 200 may be arranged in the core region of the substrate 100 and a part of the peripheral region closer to the core region.

In one possible example, as shown in FIG. 46, the first barrier layer 200 covers the core region and a part of the peripheral region. That is, the core region is located in an interior region of an orthographic projection of the first barrier layer 200 on the substrate 100. The material of the first barrier layer 200 may be silicon nitride, and a thickness of the first barrier layer 200 may be in a range of 200 nm to 600 nm.

The dielectric layer 300 is arranged on the substrate 100 and a part of the first barrier layer 200. That is, the dielectric layer 300 partially overlaps the first barrier layer 200. The thickness of the dielectric layer 300 may be in a range of 50 nm to 200 nm. The dielectric layer 300 may have a relatively high dielectric constant, and the material of the dielectric layer 300 may be hafnium oxide, silicon-doped hafnium oxide, silicon-doped zirconium oxide, and the like.

As shown in FIG. 46, the dielectric layer 300 covers the substrate 100 in the peripheral region and a part of the first barrier layer 200 closer to the peripheral region. Exemplarily, the orthographic projection of the dielectric layer 300 on the substrate 100 overlaps the orthographic projection of the first barrier layer 200 on the substrate 100, and a width dimension of an overlapped region is in a range of 20 nm-100 nm.

A first conductive layer 400 is arranged on the dielectric layer 300. As shown in FIG. 46, the first conductive layer 400 covers an upper surface of the dielectric layer 300. The material of the first conductive layer 400 may be polycrystalline silicon, and the thickness of the first conductive layer 400 may be in a range of 300 nm to 600 nm.

With continued reference to FIG. 46, the semiconductor structure further includes a third conductive layer 500 and a second barrier layer 600. The third conductive layer 500 is arranged on the first barrier layer 200 and the first conductive layer 400, and the second barrier layer 600 is arranged on the third conductive layer 500.

The third conductive layer 500 may include a titanium nitride layer closer to the substrate 100, and a tungsten layer arranged on the titanium nitride layer. The thickness of the third conductive layer 500 may be in a range of 50 nm to 200 nm, and the material of the second barrier layer 600 may be silicon nitride.

With continued reference to FIG. 46, the surface, away from the substrate 100, of the second barrier layer 600 is flush, and the upper surface of the third conductive layer 500 is not exposed. That is, the second barrier layer 600 covers the upper surface of the third conductive layer 500. As shown in FIG. 46, the upper surfaces of the dielectric layer 300, the first conductive layer 400 and the third conductive layer 500 are stepped in a junction region of the first barrier layer 200 and the substrate 100. The upper surface of the second barrier layer 600 is flush.

It is to be noted that a bit line contact hole is formed on an upper surface of the first barrier layer 200. The bit line contact hole extends to the substrate 100. The bottom of the bit line contact hole exposes the active area 110 in the core region. The bit line contact hole is filled with the second conductive layer 800. The second conductive layer 800 may be flush with the first barrier layer 200. It will be appreciated that the third conductive layer 500 is arranged on the first barrier layer 200 and the second conductive layer 800, and the second conductive layer 800 is electrically connected to the third conductive layer 500.

Referring to FIG. 48 and FIG. 49, an epitaxial layer 900 is arranged on a part of the active area 110 located in the peripheral region, and the epitaxial layer 900 contains a preset metal. As shown in FIG. 48, the epitaxial layer 900 is not arranged in a part of the active area 110, and an NMOS is subsequently formed in the part of the active area 110. As shown in FIG. 49, the epitaxial layer 900 is arranged in a part of the active area 110, and a PMOS is subsequently formed in the part of the active area 110. The material of the active area 110 and the epitaxial layer 900 may be silicon. The preset metal may be germanium.

The semiconductor structure provided by the embodiments of the present application includes a substrate 100, a first barrier layer 200, a dielectric layer 300 and a first conductive layer 400. The substrate 100 includes a core region and a peripheral region located outside the core region and adjacent to the core region. An active area is further arranged in the substrate 100. The first barrier layer 200 is arranged on the substrate 100 and at least covers the core region. The dielectric layer 300 is arranged on the substrate 100 and a part of the first barrier layer 200, and the first conductive layer 400 is arranged on the dielectric layer 300. By arranging the dielectric layer 300 on the substrate 100 and a part of the first barrier layer 200, a part of the region of the substrate 100 covers the first barrier layer 200, a part of the region of the substrate 100 covers the dielectric layer 300, and the first barrier layer 200 partially overlaps the dielectric layer 300. Therefore, the exposure of the substrate 100 is reduced, the risk of removing a part of the substrate 100 is reduced, and the risk of exposing or even damaging a device in the substrate 100 is reduced.

The various embodiments or implementations in the specification are described incrementally, each embodiment is described with emphasis on the difference from the other embodiments, and the same or similar parts among the various embodiments refer to each other.

In the description of the specification, the description of reference terms (for example, "one implementation", "some implementations", "an exemplary implementation", "an example", "a specific example", or "some examples", and the like is intended that a specific feature, structure, material, or characteristic described in combination with implementations or examples is included in at least one embodiment or example of the present disclosure. In the specification, the schematic description on the above terms unnecessarily refers to the same implementation or example. Furthermore, a described specific feature, structure, material, or characteristic may be combined in any suitable manner in any one or more implementations or examples.

Finally, it is to be noted that: the above embodiments are only used to describe the technical solutions of the present disclosure and are not intended to limit the present disclosure. Although the present disclosure has been described in detail with reference to the foregoing embodiments, those skilled in the art will appreciate that the technical solutions of the above embodiments may still be modified, or some or all of the technical features thereof may be equivalently replaced, and through these modifications and replacements, the nature of the corresponding technical solutions do not depart from the scope of the technical solutions of the embodiments of the present disclosure.

The invention claimed is:

1. A method for manufacturing a semiconductor structure, comprising:
    providing a substrate, the substrate comprising a core region, and a peripheral region located outside the core region and adjacent to the core region, a preset barrier layer being further formed on the substrate and covering the core region and the peripheral region;
    removing at least a part of the preset barrier layer corresponding to the peripheral region, so as to expose a part of the substrate, and to take a reserved part of the preset barrier layer as a first barrier layer;
    successively forming a dielectric layer and a first conductive layer, which are laminated, on the first barrier layer and the substrate; and
    removing a part of the dielectric layer and a part of the first conductive layer on the first barrier layer, to reserve a part of the dielectric layer and a part of the first conductive layer on the first barrier layer closer to the peripheral region, wherein an orthographic projection of the dielectric layer on the substrate partially overlaps an orthographic projection of the first barrier layer on the substrate to form an overlapped region, and a width of the overlapped region is in a range of 20 nm to 100 nm.

2. The method for manufacturing a semiconductor structure of claim 1, wherein the removing at least a part of the preset barrier layer corresponding to the peripheral region, so as to expose a part of the substrate, and to take a reserved part of the preset barrier layer as a first barrier layer comprises:
    forming a first photoresist layer on the preset barrier layer, wherein the first photoresist layer at least covers a part of the preset barrier layer corresponding to the core region;
    etching the preset barrier layer by taking the first photoresist layer as a mask, so as to take the reserved part of the preset barrier layer that is etched as the first barrier layer; and
    removing the first photoresist layer.

3. The method for manufacturing a semiconductor structure of claim 1, wherein the removing a part of the dielectric layer and a part of the first conductive layer on the first barrier layer, to reserve a part of the dielectric layer and a part of the first conductive layer on the first barrier layer closer to the peripheral region comprises:
    forming a second photoresist layer on the first conductive layer, wherein an orthographic projection of the second photoresist layer on the substrate partially overlaps an orthographic projection of a part of the first barrier layer on the substrate;

etching the first conductive layer and the dielectric layer by taking the second photoresist layer as a mask, so as to expose the first barrier layer; and removing the second photoresist layer.

4. The method for manufacturing a semiconductor structure of claim 1, wherein an active area is further arranged in the substrate; and after the removing a part of the dielectric layer and a part of the first conductive layer on the first barrier layer, to reserve a part of the dielectric layer and a part of the first conductive layer on the first barrier layer closer to the peripheral region, the method for manufacturing a semiconductor structure further comprises:

forming a bit line contact hole on the first barrier layer and the substrate, a bottom of the bit line contact hole exposing the active area in the core region;

forming a second conductive layer in the bit line contact hole, the second conductive layer being flush with the first barrier layer;

forming a third conductive layer on the first barrier layer, the second conductive layer and the first conductive layer; and forming a second barrier layer on the third conductive layer.

5. The method for manufacturing a semiconductor structure of claim 4, further comprising, after the forming a second barrier layer on the third conductive layer, performing a planarization treatment on a surface, away from the substrate, of the second barrier layer, without exposing the third conductive layer.

6. The method for manufacturing a semiconductor structure of claim 5, wherein the planarization treatment on the surface, away from the substrate, of the second barrier layer is performed by chemical mechanical polishing.

7. The method for manufacturing a semiconductor structure of claim 5, wherein the forming a third conductive layer on the first barrier layer, the second conductive layer and the first conductive layer comprises:

depositing a titanium nitride layer on the first barrier layer, the second conductive layer and the first conductive layer; and depositing a tungsten layer on the titanium nitride layer.

8. The method for manufacturing a semiconductor structure of claim 4, further comprising, after the removing a part of the dielectric layer and a part of the first conductive layer on the first barrier layer, to reserve a part of the dielectric layer and a part of the first conductive layer on the first barrier layer closer to the peripheral region, epitaxially growing an epitaxial layer on a part of the active area in the peripheral region, the epitaxial layer containing a preset metal.

9. The method for manufacturing a semiconductor structure of claim 8, wherein both materials of the active area and the epitaxial layer are silicon and the preset metal is germanium.

10. The method for manufacturing a semiconductor structure of claim 1, wherein the peripheral region is provided at a peripheral edge of the core region, and the core region is located in an orthographic projection of the first barrier layer on the substrate.

11. The method for manufacturing a semiconductor structure of claim 1, wherein a material of the first barrier layer contains silicon nitride, and a material of the first conductive layer contains polycrystalline silicon.

12. A semiconductor structure, comprising:

a substrate, the substrate comprising a core region, and a peripheral region located outside the core region and adjacent to the core region, and an active area being further arranged in the substrate;

a first barrier layer arranged on the substrate, covering at least the core region;

a dielectric layer arranged on the substrate and a part of the first barrier layer; and a first conductive layer arranged on the dielectric layer, wherein an orthographic projection of the dielectric layer on the substrate partially overlaps an orthographic projection of the first barrier layer on the substrate to form an overlapped region, and a width of the overlapped region is in a range of 20 nm to 100 nm.

13. The semiconductor structure of claim 12, wherein a bit line contact hole is formed on the first barrier layer, the bit line contact hole extends to the substrate, and a bottom of the bit line contact hole exposes the active area in the core region; and the bit line contact hole is filled with a second conductive layer, and the second conductive layer is flush with the first barrier layer.

14. A semiconductor structure, comprising:

a substrate, the substrate comprising a core region, and a peripheral region located outside the core region and adjacent to the core region, and an active area being further arranged in the substrate;

a first barrier layer arranged on the substrate, covering at least the core region;

a dielectric layer arranged on the substrate and a part of the first barrier layer;

a first conductive layer arranged on the dielectric layer;

a third conductive layer arranged on the first barrier layer and the first conductive layer, and a second barrier layer arranged on the third conductive layer, wherein a surface, away from the substrate, of the second barrier layer is flush.

* * * * *